(12) United States Patent
Tan

(10) Patent No.: US 11,444,130 B2
(45) Date of Patent: Sep. 13, 2022

(54) DISPLAY SUBSTRATE, DISPLAY METHOD THEREOF, DISPLAY DEVICE, AND FINE METAL MASK

(71) Applicant: BOE Technology Group Co., Ltd., Beijing (CN)

(72) Inventor: Wenjing Tan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 377 days.

(21) Appl. No.: 16/615,971

(22) PCT Filed: Mar. 20, 2019

(86) PCT No.: PCT/CN2019/078879
§ 371 (c)(1),
(2) Date: Nov. 22, 2019

(87) PCT Pub. No.: WO2020/001087
PCT Pub. Date: Jan. 2, 2020

(65) Prior Publication Data
US 2021/0376008 A1      Dec. 2, 2021

(30) Foreign Application Priority Data
Jun. 29, 2018   (CN) .......................... 201810714668.0

(51) Int. Cl.
*H01L 27/32* (2006.01)
*G09G 3/3275* (2016.01)
*H01L 51/56* (2006.01)

(52) U.S. Cl.
CPC ....... *H01L 27/3218* (2013.01); *G09G 3/3275* (2013.01); *H01L 27/326* (2013.01);
(Continued)

(58) Field of Classification Search
CPC .......................... H01L 27/3218; H01L 27/326
See application file for complete search history.

(56) References Cited

U.S. PATENT DOCUMENTS

2005/0001542 A1    1/2005   Kiguchi
2006/0152531 A1    7/2006   Lin et al.
(Continued)

FOREIGN PATENT DOCUMENTS

CN        1550846 A       12/2004
CN        205355055 U     6/2016
(Continued)

OTHER PUBLICATIONS

Corresponding IN Office Action 201947049910 dated May 28, 2021.
(Continued)

*Primary Examiner* — Douglas M Menz
(74) *Attorney, Agent, or Firm* — ArentFox Schiff LLP; Michael Fainberg

(57) ABSTRACT

Disclosed are a display panel, a display method thereof, a display device, and a fine metal mask, and a display area of the display substrate includes a first display sub-area and a second display sub-area, where a plurality of uniformly distributed sub-pixels are arranged in the second display sub-area, and a distribution density of pixels in the first display sub-area is higher than a distribution density of pixels in the second display sub-area.

20 Claims, 16 Drawing Sheets

(52) U.S. Cl.
CPC ..... *H01L 51/56* (2013.01); *G09G 2300/0452* (2013.01); *G09G 2310/027* (2013.01)

(56) References Cited

U.S. PATENT DOCUMENTS

| | | |
|---|---|---|
| 2015/0364526 A1 | 12/2015 | Peng et al. |
| 2016/0027359 A1 | 1/2016 | Guo et al. |
| 2016/0203748 A1* | 7/2016 | Matsueda ............ G09G 3/2074 345/694 |
| 2016/0267847 A1 | 9/2016 | Chen et al. |
| 2017/0076654 A1 | 3/2017 | Wang |
| 2018/0088260 A1 | 3/2018 | Jin et al. |
| 2018/0165533 A1 | 6/2018 | Cho et al. |
| 2019/0212788 A1* | 7/2019 | Kwak .................... G06F 3/041 |
| 2019/0310724 A1* | 10/2019 | Yeke Yazdandoost ...................... G06V 40/1318 |
| 2020/0043994 A1* | 2/2020 | Chen ...................... G09G 3/325 |
| 2021/0013277 A1* | 1/2021 | Liu .................... H01L 27/3234 |
| 2021/0359053 A1 | 11/2021 | Shan |

FOREIGN PATENT DOCUMENTS

| | | |
|---|---|---|
| CN | 106921767 A | 7/2017 |
| CN | 107819018 A | 3/2018 |
| CN | 107945767 A | 4/2018 |
| CN | 107948354 A | 4/2018 |
| CN | 207264695 U | 4/2018 |
| CN | 108520888 A | 9/2018 |
| CN | 208507679 U | 2/2019 |
| EP | 2843466 A1 | 4/2015 |
| JP | 2016195782 A | 11/2016 |
| KR | 1020150107883 A | 9/2015 |
| KR | 1020180067196 A | 6/2018 |

OTHER PUBLICATIONS

Extended European Search Report dated Feb. 11, 2022 for EP application No. 19826064.8.
Office Action dated Mar. 28, 2022 for Korean Application No. 10-2020-7017998.

* cited by examiner

| 10 | 11 | 12 | 13 | 14 | 15 | 16 | 17 | 18 | 19 |
|----|----|----|----|----|----|----|----|----|----|
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |

Fig. 10

| 10 |  | 12 |  | 14 |  | 16 |  | 18 |  |
|----|--|----|--|----|--|----|--|----|--|
|    |  |    |  |    |  |    |  |    |  |
| 30 |  | 32 |  | 34 |  | 36 |  | 38 |  |
|    |  |    |  |    |  |    |  |    |  |
| 50 |  | 52 |  | 54 |  | 56 |  | 58 |  |
|    |  |    |  |    |  |    |  |    |  |
| 70 |  | 72 |  | 74 |  | 76 |  | 78 |  |
|    |  |    |  |    |  |    |  |    |  |

Fig. 11a

|    | 11 |    | 13 |    | 15 |    | 17 |    | 19 |
|----|----|----|----|----|----|----|----|----|----|
|    |    |    |    |    |    |    |    |    |    |
|    | 31 |    | 33 |    | 35 |    | 37 |    | 39 |
|    |    |    |    |    |    |    |    |    |    |
|    | 51 |    | 53 |    | 55 |    | 57 |    | 59 |
|    |    |    |    |    |    |    |    |    |    |
|    | 71 |    | 73 |    | 75 |    | 77 |    | 79 |
|    |    |    |    |    |    |    |    |    |    |

Fig. 11b

| 20 |    | 22 |    | 24 |    | 26 |    | 28 |    |
|----|----|----|----|----|----|----|----|----|----|
| 40 |    | 42 |    | 44 |    | 46 |    | 48 |    |
| 60 |    | 62 |    | 64 |    | 66 |    | 68 |    |
| 80 |    | 82 |    | 84 |    | 86 |    | 88 |    |

DISPLAY SUBSTRATE, DISPLAY METHOD THEREOF, DISPLAY DEVICE, AND FINE METAL MASK

This application is a National Stage of International Application No. PCT/CN2019/078879, filed on Mar. 20, 2019, which claims the priority of Chinese Patent Application No. 201810714668.0, filed with the Chinese Patent Office on Jun. 29, 2018, and entitled "A display substrate, a display method thereof, a display device, and a fine metal mask", both of which are hereby incorporated by reference in their entireties.

FIELD

This disclosure relates to the field of display technologies, and particularly to display substrate, a display method thereof, a display device, and a fine metal mask.

BACKGROUND

As the display technologies are advancing, an all-screen panel with a high screen to panel ratio, and an ultra-narrow bezel can greatly improve a visual effect for a watcher as compared with a normal display screen, and thus has been widely favored. At present, in order to take a photo of a user herself or himself, to conduct visible communication, to recognize a fingerprint, and to perform other functions in a display device including an all-screen panel, e.g., a mobile phone, typically a front camera, an earphone, a finger recognition area, a physical button, etc., are arranged on the front face of the display device. However the arrangement of these indispensable function elements may become a significant factor of hindering the screen to panel ratio from being improved.

SUMMARY

An embodiment of this disclosure provides a display substrate including a display area including:

a first display sub-area; and a second display sub-area, wherein a plurality of sub-pixels are uniformly distributed in the second display sub-area; and a distribution density of pixels in the first display sub-area is higher than a distribution density of pixels in the second display sub-area.

Optionally in some embodiments of this disclosure, at least a part of sides of the second display sub-area coincide with at least a part of sides of the display area, and the other sides of the second display sub-area are surrounded by the first display sub-area.

Optionally in some embodiments of this disclosure, the first display sub-area and the second display sub-area are arranged in the row direction, or the first display sub-area and the second display sub-area are arranged in the column direction.

Optionally in some embodiments of this disclosure, the first display sub-area is arranged to surround the second display sub-area.

Optionally in some embodiments of this disclosure, the second display sub-area is one of a round, a drop of water, a rectangle, and a trapezium.

Optionally in some embodiments of this disclosure, the first display sub-area and the second display sub-area form the consecutive display area, and the shape of the display area is substantially rectangular.

Optionally in some embodiments of this disclosure, the second display sub-area is located at a corner of the display area.

Optionally in some embodiments of this disclosure, the area of the second display sub-area is smaller than the area of the first display sub-area.

Optionally in some embodiments of this disclosure, the second display sub-area includes a plurality of third pixel elements arranged in a rectangular pattern, and each third pixel element includes a first sub-pixel, a second sub-pixel, and a third sub-pixel; and in the same third pixel element, the first sub-pixel and the third sub-pixel are arranged in the same row and adjacent to each other, and the second sub-pixel is located in an adjacent row to the row where the first sub-pixel and the third sub-pixel are located.

Optionally in some embodiments of this disclosure, the centers of sub-pixels with a same color among the first sub-pixels, the second sub-pixels, and the third sub-pixels in the second display sub-area are distributed uniformly.

Optionally in some embodiments of this disclosure, sub-pixels with a same color among the first sub-pixels, the second sub-pixels, and the third sub-pixels in the second display sub-area are arranged at a uniform interval in the row direction, and arranged at a uniform interval in the column direction.

Optionally in some embodiments of this disclosure, sub-pixels with a same color among the first sub-pixels, the second sub-pixels, and the third sub-pixels in the second display sub-area are arranged in different columns in adjacent rows, and centers of two adjacent sub-pixels in the same row have a same distance from a center of the sub-pixel which is in a row adjacent to the two adjacent sub-pixels and is closest to the two adjacent sub-pixels.

Optionally in some embodiments of this disclosure, sub-pixels with the same color among the first sub-pixels, the second sub-pixels, and the third sub-pixels in the second display sub-area are arranged in different rows in adjacent columns, and centers of two adjacent sub-pixels in the same column have a same distance from a center of the sub-pixel which is in a column adjacent to the two adjacent sub-pixels and is closest to the two adjacent sub-pixels.

Optionally in some embodiments of this disclosure, sub-pixels in the same column of third pixel elements in the second display sub-area are arranged in the same or reverse pattern.

Optionally in some embodiments of this disclosure, for two adjacent third pixel elements in the row direction in the second display sub-area, the first sub-pixel and the third sub-pixel in one of the third pixel elements are located in the same row as the second sub-pixel 2 in the other third pixel element.

Optionally in some embodiments of this disclosure, in the same third pixel element in the second display sub-area, an orthographical projection of the center of the second sub-pixel onto a line connecting the center of the first sub-pixel with the center of the third sub-pixel lies between the center of the first sub-pixel, and the center of the third sub-pixel.

Optionally in some embodiments of this disclosure, sub-pixels with the same color in adjacent third pixel elements in the row direction in the second display sub-area are not adjacent to each other.

Optionally in some embodiments of this disclosure, light-emission areas of a first sub-pixel, a second sub-pixel, and a third sub-pixel in the second display sub-area are substantially same.

Optionally in some embodiments of this disclosure, shapes of a first sub-pixel, a second sub-pixel, and a third sub-pixel in the second display sub-area are substantially same.

Optionally in some embodiments of this disclosure, the first display sub-area includes a plurality of first pixel elements and second pixel elements arranged adjacent to each other, wherein each first pixel element includes a first sub-pixel and a second sub-pixel, and each second pixel element includes a third sub-pixel and a second sub-pixel.

Optionally in some embodiments of this disclosure, the first pixel elements and the second pixel elements are arranged alternately in the column direction, and the first pixel elements and the second pixel elements are arranged alternately in the row direction, in the first display sub-area.

Optionally in some embodiments of this disclosure, the second sub-pixel and the first sub-pixel in each first pixel element are arranged in the same row, and the second sub-pixel and the third sub-pixel in each second pixel element are arranged in the same row; and for the first pixel element and the second pixel element adjacent in the row direction, the second sub-pixel in the first pixel element is not adjacent to the second sub-pixel in the second pixel element.

Optionally in some embodiments of this disclosure, there is substantially the same light-emission area of a first sub-pixel, a second sub-pixel, and a third sub-pixel in the first display sub-area.

Optionally in some embodiments of this disclosure, for respective first pixel elements and respective second pixel elements in the same column, the second sub-pixels 2 in the respective first pixel elements are located in the same column as the second sub-pixels in the respective second pixel elements.

Optionally in some embodiments of this disclosure, the shape of the first sub-pixels in the first display sub-area is a rectangle.

Optionally in some embodiments of this disclosure, the second sub-pixel and the first sub-pixel in each first pixel element are arranged in the same row, and the second sub-pixel and the third sub-pixel in each second pixel element are arranged in different rows and in different columns; and two second sub-pixels are not adjacent to each other in the first pixel element and the second pixel element adjacent in the row direction; and the first pixel element and the second pixel element adjacent in the column direction are a group of pixels, and in the same group of pixels, the second sub-pixel in the first pixel element is located in the same column as the second sub-pixel in the second pixel element.

Optionally in some embodiments of this disclosure, in the same group of pixels, two second sub-pixels are arranged adjacent to each other in the column direction, and symmetric in the row direction.

Optionally in some embodiments of this disclosure, two adjacent second sub-pixels in the column direction in the first display sub-area are a group of second sub-pixels, and the distance between two adjacent groups of second sub-pixels in the column direction in the first display sub-area is equal to the distance between two adjacent second sub-pixels in the column direction in the second display sub-area.

Optionally in some embodiments of this disclosure, in the same group of pixels, the shapes of the first sub-pixel and the third sub-pixel are the same, and the shape of a combination of two adjacent second sub-pixels in the column direction is the same as the shape of the first sub-pixel.

Optionally in some embodiments of this disclosure, in the first display sub-area, both the shape of the first sub-pixels, and the shape of the third sub-pixels 3 are a hexagon, and the shape of the second sub-pixels is a pentagon.

Optionally in some embodiments of this disclosure, the spacing between two adjacent first sub-pixels in the column direction in the first display sub-area is not larger than the spacing between two adjacent first sub-pixels in the column direction in the second display sub-area; and the spacing between two adjacent third sub-pixels in the column direction in the first display sub-area is not larger than the spacing between two adjacent third sub-pixels in the column direction in the second display sub-area.

Optionally in some embodiments of this disclosure, a light-emitting area of a second sub-pixel in the second display sub-area is not smaller than a light-emitting area of a second sub-pixel in the first display sub-area;

a light-emitting area of a first sub-pixel in the second display sub-area is substantially equal to a light-emitting area of a first sub-pixel in the first display sub-area; and a light-emitting area of a third sub-pixel in the second display sub-area is substantially equal to a light-emitting area of a third sub-pixel in the first display sub-area.

Optionally in some embodiments of this disclosure, the shape of the first sub-pixels in the second display sub-area are substantially the same as the shape of the first sub-pixels in the first display sub-area; and the shape of the third sub-pixels in the second display sub-area are substantially the same as the shape of the third sub-pixels in the first display sub-area.

Optionally in some embodiments of this disclosure, in the first display sub-area, a light-emitting area of a second sub-pixel is not larger than a light-emitting area of a first sub-pixel, and a light-emitting area of a second sub-pixel is not larger than a light-emitting area of a third sub-pixel.

Optionally in some embodiments of this disclosure, the sub-pixels in the second display sub-area are located in the same row as a part of the sub-pixels in the first display sub-area.

Optionally in some embodiments of this disclosure, the sub-pixels in the second display sub-area are be located in the same column as a part of the sub-pixels in the first display sub-area.

Optionally in some embodiments of this disclosure, the second sub-pixels in the second display sub-area, and the second sub-pixels in the first display sub-area are located in at least one of the same row and the same column.

Optionally in some embodiments of this disclosure, the first sub-pixels in the second display sub-area, and the first sub-pixels in the first display sub-area are located in at least one of the same row and the same column.

Optionally in some embodiments of this disclosure, the third sub-pixels in the second display sub-area, and the third sub-pixels in the first display sub-area are located in at least one of the same row and the same column.

Optionally in some embodiments of this disclosure, the distribution density of the first sub-pixels in the second display sub-area in the row direction is ½ of the distribution density of the first sub-pixels in the first display sub-area in the row direction;

the distribution density of the third sub-pixels in the second display sub-area in the row direction is ½ of the distribution density of the third sub-pixels in the first display sub-area in the row direction; and the distribution density of the second sub-pixels in the second display sub-area in the row direction is ¼ of the distribution density of the second sub-pixels in the first display sub-area in the row direction.

An embodiment of this disclosure provides a display device comprising the display substrate above.

An embodiment of this disclosure provides a fine metal mask for fabricating the display substrate above, the fine metal mask including a plurality of opening areas corresponding in shape and position to one of the first sub-pixels, the second sub-pixels, and the third sub-pixels.

Correspondingly an embodiment of this disclosure further provides a display method of the display substrate above, the method including:

receiving raw image data; and for a sub-pixel in the first display sub-area, displaying at a grayscale of a corresponding sub-pixel in the raw image data;

for a sub-pixel in the second display sub-area, determining the quantity N of pixels in the raw image data, corresponding to a pixel according to the ratio of the distribution density of pixels in the first display sub-area to the distribution density of pixels in the second display sub-area; and displaying according to a grayscale or grayscales of one or more of the N pixels in the raw image data, corresponding to the position of the pixel.

Optionally in some embodiments of this disclosure, for a pixel in the second display sub-area, displaying at an average grayscale of the N pixels in the raw image data, corresponding to the position of the pixel.

Optionally in some embodiments of this disclosure, for a pixel in the second display sub-area, displaying at a grayscale of the pixel of the highest brightness among the N pixels in the raw image data, corresponding to the position of the pixel.

Optionally in some embodiments of this disclosure, for a pixel in the second display sub-area, displaying at a grayscale of a pixel of intermediate brightness among the N pixels in the raw image data, corresponding to the position of the pixel.

Optionally in some embodiments of this disclosure, for a pixel in the second display sub-area, displaying according to the N pixels in the raw image data, corresponding to the position of the pixel, and a relative position relationship between the pixel in the second display sub-area, and the N pixels in the raw image data.

Optionally in some embodiments of this disclosure, the ratio of the distribution density of pixels in the first display sub-area to the distribution density in the second display sub-area is n, wherein n is an integer greater than 1; and a pixel in the second display area corresponds to n*n pixels, arranged in a rectangular pattern, in the raw image data.

Optionally in some embodiments of this disclosure, for a pixel in the second display sub-area, a pixel at the same position among n*n pixel in the raw image data, corresponding to the pixel is a reference pixel, and displaying at pixels in the second display sub-area at the grayscale of the reference pixel corresponding to the pixel.

BRIEF DESCRIPTION OF THE DRAWINGS

FIG. 10 is a schematic diagram of pixels in initial image data, corresponding to respective sub-pixels in the second display sub-area in the display method according to an embodiment of this disclosure;

FIG. 11a is a first schematic diagram of reference pixels in the initial image data, corresponding to the respective sub-pixels in the second display sub-area in the display method according to an embodiment of this disclosure;

FIG. 11b is a second schematic diagram of the reference pixels in the initial image data, corresponding to the respective sub-pixels in the second display sub-area in the display method according to an embodiment of this disclosure;

FIG. 11c is a third schematic diagram of the reference pixels in the initial image data, corresponding to the respective sub-pixels in the second display sub-area in the display method according to an embodiment of this disclosure; and FIG. 11d is a fourth schematic diagram of the reference pixels in the initial image data, corresponding to the respective sub-pixels in the second display sub-area in the display method according to an embodiment of this disclosure.

DETAILED DESCRIPTION OF THE EMBODIMENTS

Figure 1A:
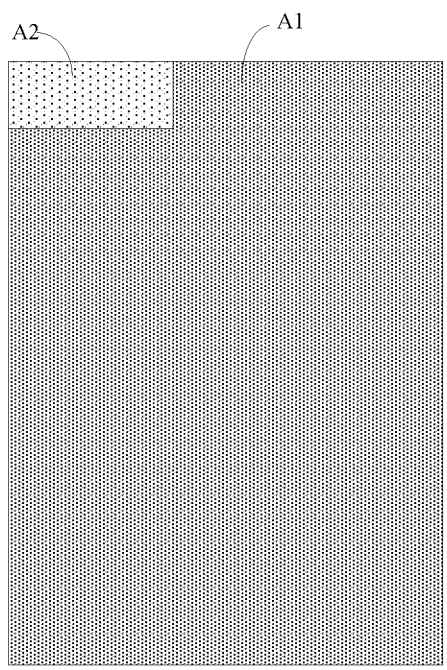
FIG. 1a is a first schematic structural diagram of a display substrate according to an embodiment of this disclosure.

Some embodiments of this disclosure provide a display substrate, a display method thereof, and a fine metal mask. In order to make the objects, technical solutions, and advantages of this disclosure more apparent, this disclosure will be described below in further details with reference to the drawings. Apparently the embodiments to be described are only a part but not all of the embodiments of this disclosure. Based upon the embodiments here of this disclosure, all the other embodiments which can occur to those ordinarily skilled in the art without any inventive effort shall come into the scope of this disclosure as claimed.

The shapes and the sizes of respective components in the drawings are not intended to reflect any real proportion, but only intended to illustrate the disclosure of this application.

As illustrated in FIG. 1a to FIG. 1i, a display substrate according to an embodiment of this disclosure includes a display area including a first display sub-area A1 and a second display sub-area A2; and as illustrated in FIG. 2 to FIG. 7, a plurality of uniformly distributed sub-pixels are arranged in the second display sub-area A2. A distribution density of pixels in the first display sub-area A1 is higher than a distribution density of pixels in the second display sub-area A2.

In the display panel according to an embodiment of this disclosure, the display area is arranged as the first display sub-area in which pixels are distributed at a high density (i.e., a high resolution), and the second display sub-area in which pixels are distributed at a low density (i.e., a low resolution). Since there is a low distribution density of pixels in the display sub-area, a camera, a sensor, an earphone, and other elements can be arranged in the second display sub-area, that is, a local distribution density of pixels can be lowered to thereby improve the transmittivity of light through a screen so as to improve a screen to panel ratio of the display substrate; and the sub-pixels are distributed uniformly in the second display sub-area so that there will be a uniform brightness distribution in the second display sub-area.

It shall be noted that the distribution density of pixels refers to the number of pixels arranged uniformly in a unit of area. If there are a larger number of pixels arranged in a unit of area, then there will be higher distribution density of pixels, and a higher resolution; or if there are a smaller number of pixels arranged in a unit of area, then there will be a lower distribution density of pixels, and a lower resolution.

Furthermore in an embodiment of this disclosure, the distribution density of pixels is particularly calculated in the equation of $$\rho = \frac{\sqrt{x^2 + y^2}}{S},$$

where p represents the distribution density of pixels, x represents the number of display elements in the row direction, y represents the number of display elements in the column direction, and S represents the area of a screen.

In a particular implementation, in the display panel according to an embodiment of this disclosure, the number of second display sub-areas may be one or more; and the first display sub-area may be a consecutive area, or may be an inconsecutive area, dependent upon a real application environment, although an embodiment of the invention will not be limited thereto.

In a particular implementation, in the display panel according to an embodiment of this disclosure, as illustrated in FIG. 1a to FIG. 1g, at least a part of sides of the second display sub-area A2 coincide with at least a part of sides of the display area, and the other sides of the second display sub-area A2 are surrounded by the first display sub-area A1, so that the second display sub-area A2 can be arranged at the edge of the display area.

Figure 1B:
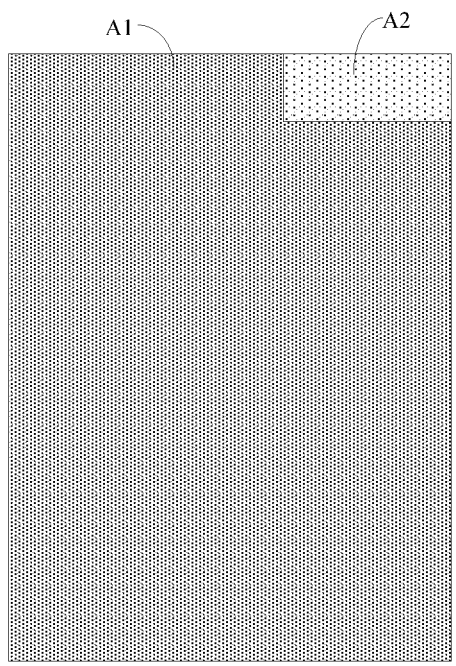
FIG. 1b is a second schematic structural diagram of the display substrate according to an embodiment of this disclosure.
Figure 1C:
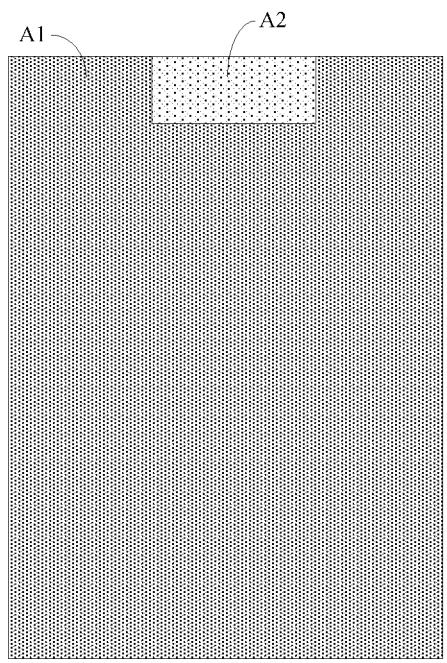
FIG. 1c is a third schematic structural diagram of the display substrate according to an embodiment of this disclosure.
Figure 1D:
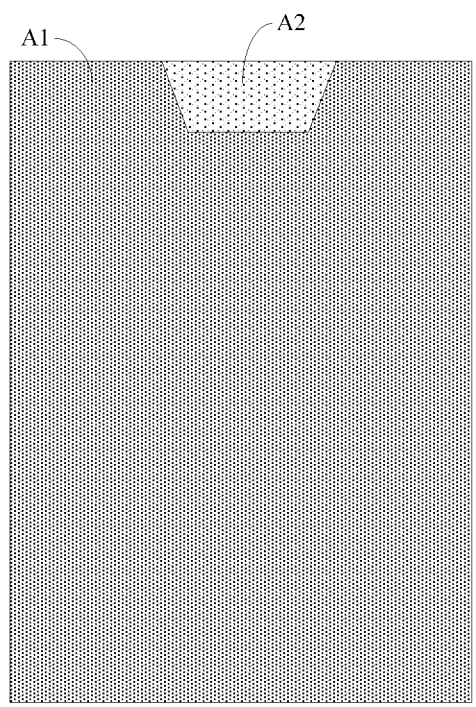
FIG. 1d is a fourth schematic structural diagram of the display substrate according to an embodiment of this disclosure.
Figure 1E:
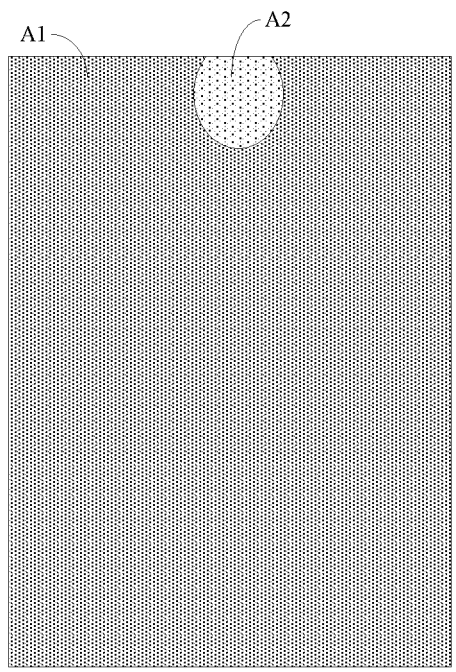
FIG. 1e is a fifth schematic structural diagram of the display substrate according to an embodiment of this disclosure.
Figure 1F:
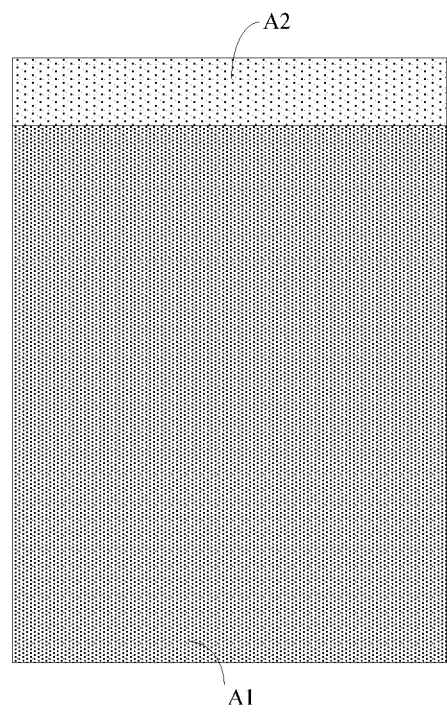
FIG. 1f is a sixth schematic structural diagram of the display substrate according to an embodiment of this disclosure.
Figure 1G:
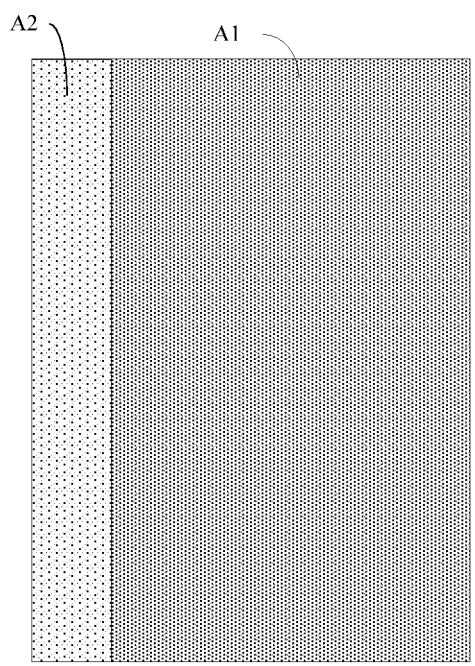
FIG. 1g is a seventh schematic structural diagram of the display substrate according to an embodiment of this disclosure.
Figure 1H:
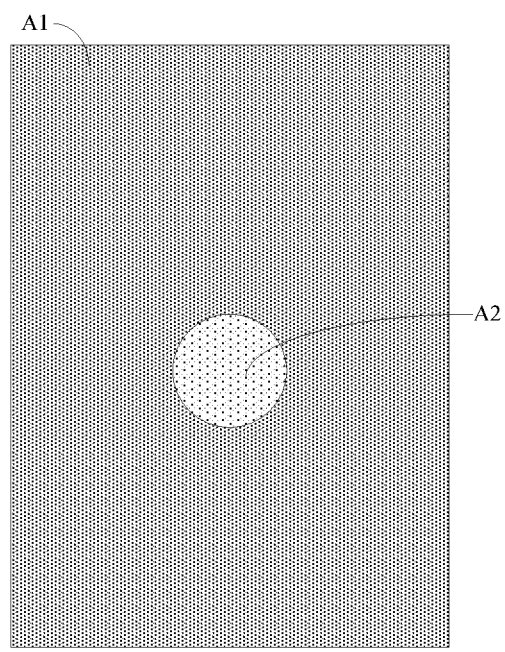
FIG. 1h is an eighth schematic structural diagram of the display substrate according to an embodiment of this disclosure.
Figure 1I:
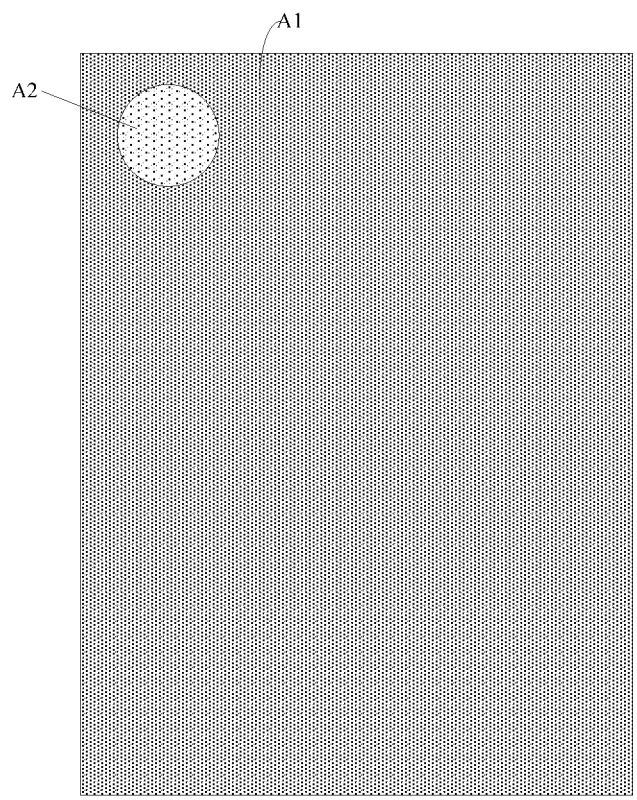
FIG. 1i is a ninth schematic structural diagram of the display substrate according to an embodiment of this disclosure.

In a particular implementation, in the display panel according to an embodiment of this disclosure, as illustrated in FIG. 1h and FIG. 1i, the first display sub-area A1 is arranged to surround the second display sub-area A2 so that the second display sub-area A2 can be arranged in the display area.

Furthermore in a particular implementation, the shape of the second display sub-area A2 can be arranged as a regular shape, and as illustrated in FIG. 1a to FIG. 1c, for example, the second display sub-area A2 can be arranged as a rectangle, where a top corner of the rectangle can be a right angle or can be an arc angle. As illustrated in FIG. 1d, the second display sub-area A2 can be arranged as a trapezium, where a top corner of the trapezium can be a normal angle or can be an arc angle. As illustrated in FIG. 1h and FIG. 1i, the second display sub-area A2 can be arranged as a round. Of course, the shape of the second display sub-area A2 can be arranged as an irregular shape. As illustrated in FIG. 1e, for example, the second display sub-area A2 can be arranged as a drop of water. Of course, the shape of the second display sub-area can be designed according to the shape of an element arranged in the second display sub-area in a real application, although an embodiment of this disclosure will not be limited thereto.

Optionally in the display panel according to an embodiment of this disclosure, as illustrated in FIG. 1a to FIG. 1i, the first display sub-area A1 and the second display sub-area A2 form the consecutive display area, and the shape of the display area is substantially rectangular, so that the first display sub-area A1 and the second display sub-area A2 can be formed as complementary patterns to form the consecutive display area. Furthermore, for example, if each top corner of the display area is a right angle, then the display area will be a rectangle, or if each top corner of the display area is an arc angle, then the shape of the display area will be substantially rectangular.

In a particular implementation, in the display panel according to an embodiment of this disclosure, a relative positional relationship between the first display sub-area and the second display sub-area, and their shapes will not be limited to any particular relative positional relationship and shapes, but can be arranged according to a screen design of the display substrate. For a mobile phone, for example, the second display sub-area A2 can be arranged at the top-left corner of the first display sub-area A1 as illustrated in FIG. 1a. The second display sub-area A2 can be arranged at the top-right corner of the first display sub-area A1 as illustrated in FIG. 1b. The second display sub-area A2 can be arranged at the middle of the top of the first display sub-area A1 as illustrated in FIG. 1c to FIG. 1e. The first display sub-area A1 and the second display sub-area A2 can be arranged in the row direction as illustrated in FIG. 1f, where the second display sub-area A2 can be located above or below the first display sub-area A1. In this way, a sensor, e.g., a sensor for recognizing a human face (e.g., an infrared sensor, etc.), can be further arranged in the second display sub-area A2. The first display sub-area A1 and the second display sub-area A2 can be arranged in the column direction as illustrated in FIG. 1g, where the second display sub-area A2 can be located to the left or right of first display sub-area A1. In this way, a sensor, e.g., a sensor for recognizing a human face (e.g., an infrared sensor, etc.), can be further arranged in the second display sub-area A2. The second display sub-area A2 can be arranged at the center of the first display sub-area A1 as illustrated in FIG. 1h. The second display sub-area A2 can be arranged at a corner (e.g., the top-left corner) of the display area as illustrated in FIG. 1i. Of course, the particular position of the second display area A2 can be determined according to a real application environment in a real application, although an embodiment of the invention will not be limited thereto.

Optionally in the display panel according to an embodiment of this disclosure, the distribution density of pixels in the second display sub-area is generally set to ½ to ⅛ of the distribution density of pixels in the first display sub-area. In a particularly implementation, the distribution density of pixels in the second display sub-area is determined according to an element to be arranged in the second display sub-area, and a display demand, although an embodiment of the invention will not be limited thereto. For example, a camera is arranged in the second display sub-area, and if the distribution density of pixels is too high, then a good display effect will be guaranteed, but a definition of photographing may be degraded, or if the distribution density of pixels is too low, then a high definition of photographing will be guaranteed, but the display effect may be degraded.

In a particular implementation, there is such an available resolution of the existing display substrate that the distribution density of pixels in the second display sub-area is generally not lower than ¼ of the distribution density of pixels in the first display sub-area. For example, the distribution density of pixels in the second display sub-area is ½, ⅓, or ¼ of the distribution density of pixels in the first display sub-area. Of course, if the resolution of the display substrate is made higher, then the ratio of the distribution density of pixels in the second display sub-area to the distribution density in the first display sub-area may be set smaller.

In a particular implementation, in the display panel according to an embodiment of this disclosure, as illustrated in FIG. 1a to FIG. 1i, the area of the second display sub-area A2 can be smaller than the area of the first display sub-area A1. Of course, the area of the second display sub-area can be designed according to an element arranged in the second display sub-area in a real application, although an embodiment of this disclosure will not be limited thereto.

Pixel elements are generally arranged in the display area, and each pixel element includes a plurality of sub-pixels; and a pixel in an embodiment of this disclosure may refer to a combination of sub-pixels which can display an image at a pixel point independently, and for example, a pixel may refer to a pixel element. Optionally in the display panel according to an embodiment of this disclosure, as illustrated in FIG. 2 to FIG. 7, the second display sub-area A2 includes a plurality of first sub-pixels 1, a plurality of second sub-pixels 2, and a plurality of third sub-pixels 3, and the centers of sub-pixels with a same color are distributed uniformly, that is, the centers of the first sub-pixels 1 are distributed uniformly, the centers of the second sub-pixels 2 are distributed uniformly, and the centers of the third sub-pixels 3 are distributed uniformly, so that an image can be displayed uniformly.

Optionally in the display panel according to an embodiment of this disclosure, as illustrated in FIG. 2 to FIG. 7, sub-pixels with a same colors in the row direction are arranged at a uniform interval, and sub-pixels with a same colors in the column direction are arranged at a uniform interval.

Figure 2:
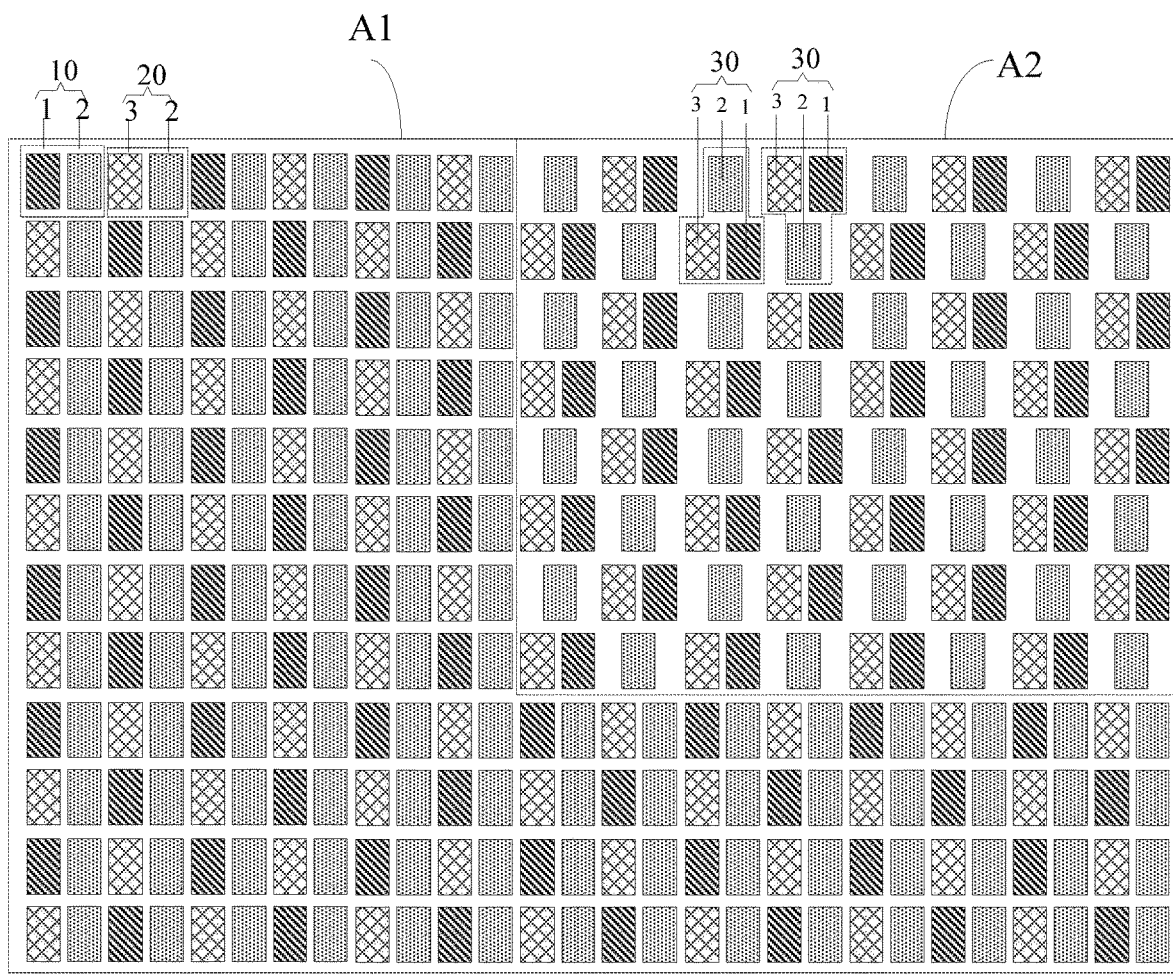
FIG. 2 is a first schematic structural diagram of a part of a first display sub-area and a second display sub-area in the display panel according to an embodiment of this disclosure.
Figure 3:
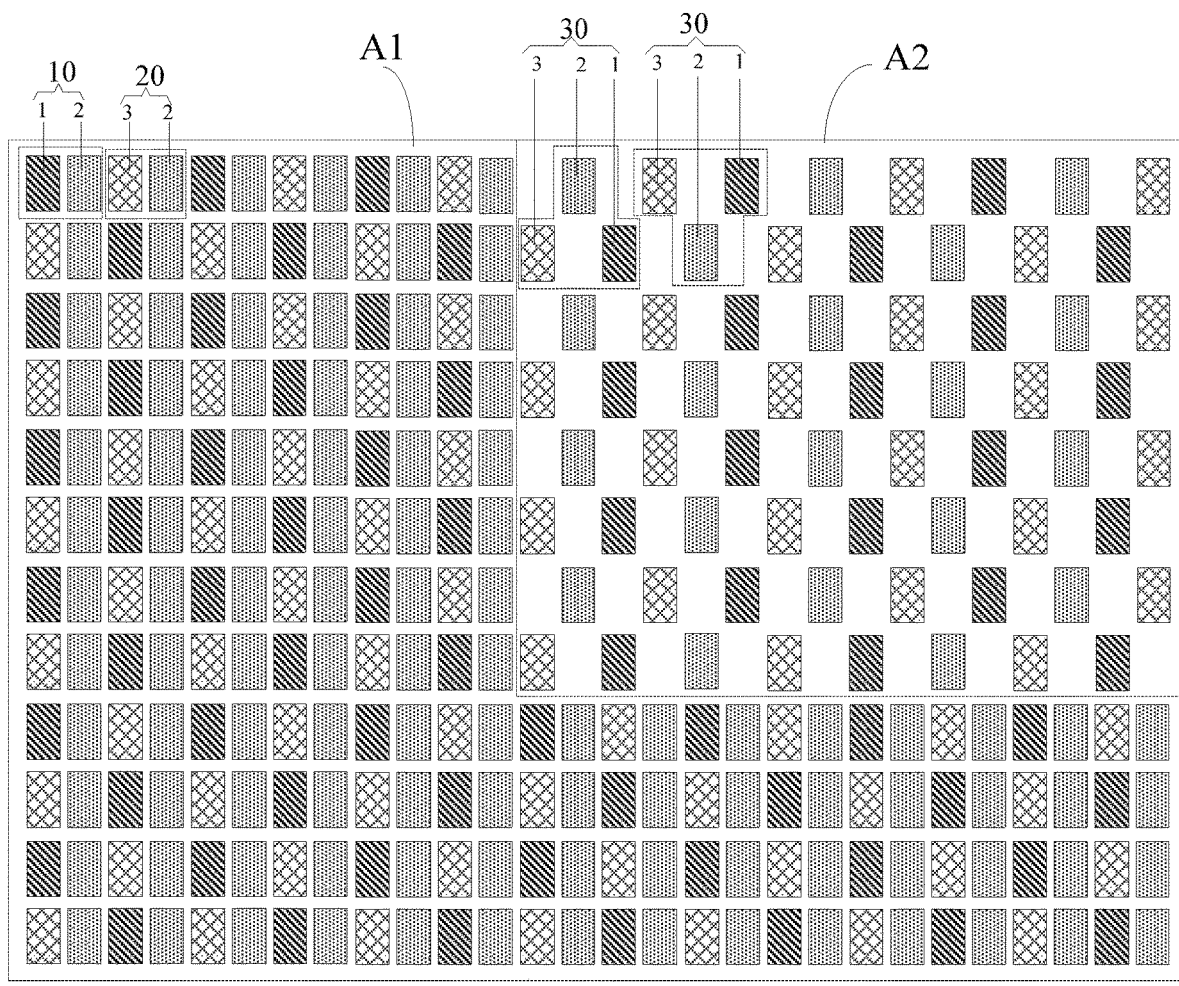
FIG. 3 is a second schematic structural diagram of a part of the first display sub-area and the second display sub-area in the display panel according to an embodiment of this disclosure.
Figure 4:
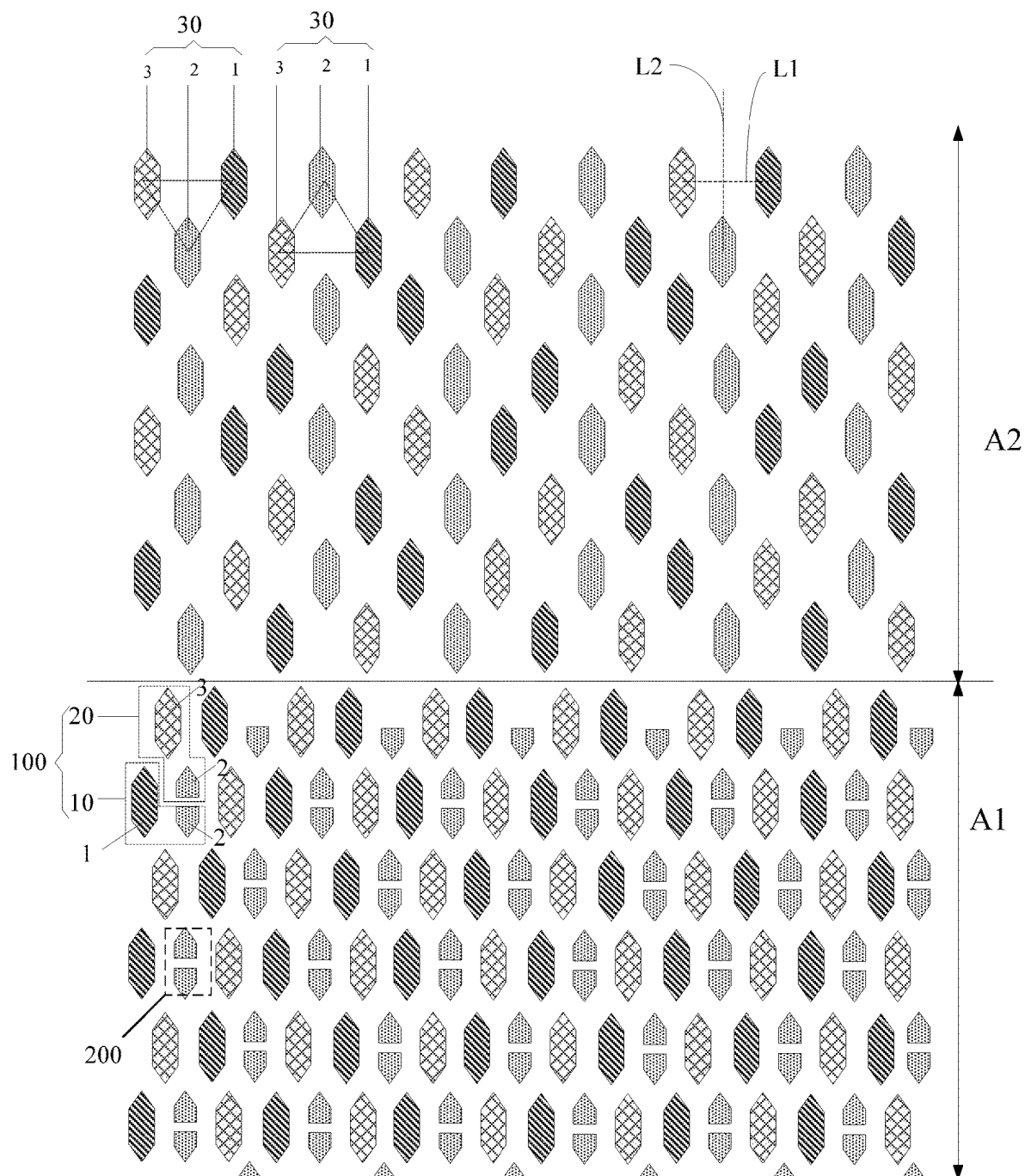
FIG. 4 is a third schematic structural diagram of a part of the first display sub-area and the second display sub-area in the display panel according to an embodiment of this disclosure.

Optionally in the display panel according to an embodiment of this disclosure, as illustrated in FIG. 2 to FIG. 5, and FIG. 7, sub-pixels with a same color in adjacent rows are arranged in different columns, and there is the same distance between the centers of two adjacent sub-pixels with a same color in the same row, and the center of their adjacent sub-pixel with a same color in an adjacent row. As illustrated in FIG. 4, for example, the first sub-pixel 1 in the second row lies on a line connecting the centers of the first sub-pixel 1 and the second first sub-pixel 1 in the first row in the second display sub-area A2.

Optionally in the display panel according to an embodiment of this disclosure, as illustrated in FIG. 2 to FIG. 5, and FIG. 7, sub-pixels with a same color in adjacent column are arranged in different rows, and there is the same distance between the centers of two adjacent sub-pixels with a same color in the same column, and the center of their adjacent sub-pixel with a same color in an adjacent column. As illustrated in FIG. 4, for example, the first sub-pixel 1 in the first column lies on a line connecting the centers of the first sub-pixel 1 and the second first sub-pixel 1 in the second column in the second display sub-area A2.

It shall be noted that there may be some error due to a limiting process condition or another factor, e.g., an arrangement of wires or through-holes, so the positions of the respective sub-pixels, and their relative position relationship can substantially satisfy the condition above without departing from the scope of this disclosure.

Optionally in the display panel according to an embodiment of this disclosure, as illustrated in FIG. 2 to FIG. 7, first sub-pixels 1, second sub-pixels 2, and third sub-pixels 3 are arranged in the second display sub-area A2, where the first sub-pixels 1 are distributed uniformly in the second display sub-area A2, the second sub-pixels 2 are distributed uniformly in the second display sub-area A2, and the third sub-pixels 3 are distributed uniformly in the second display sub-area A2.

Optionally in the display panel according to an embodiment of this disclosure, as illustrated in FIG. 3 to FIG. 7, the first sub-pixels 1, the second sub-pixels 2, and the third sub-pixels 3 are distributed uniformly in the row direction.

Optionally in the display panel according to an embodiment of this disclosure, as illustrated in FIG. 2 to FIG. 7, the second display sub-area A2 includes a plurality of third pixel elements 30 arranged in a rectangular pattern, and each third pixel element 30 includes a first sub-pixel 1, a second sub-pixel 2, and a third sub-pixel 3, where in the same third pixel element 30, the first sub-pixel 1 and the third sub-pixel 3 are arranged in the same row and adjacent to each other, and the second sub-pixel 2 is located in an adjacent row to the row where the first sub-pixel 1 and the third sub-pixel 3 are located. In this way, the three sub-pixels in the third pixel elements 30 can be arranged in a triangular pattern in the second display sub-area A2. Taking the first row of third pixel elements 30 as an example, the first sub-pixels 1 and the third sub-pixels in the third pixel elements 30 are located in the first row of sub-pixels, and the second sub-pixels 2 are located in the second row of sub-pixels.

Optionally in the display panel according to an embodiment of this disclosure, the centers of sub-pixels with a same color among the first sub-pixels, the second sub-pixels, and the third sub-pixels in the second display sub-area are distributed uniformly. As illustrated in FIG. 2 to FIG. 7, for example, the centers of the first sub-pixels 1 in the second display sub-area A2 are distributed uniformly, the centers of the second sub-pixels 2 in the second display sub-area A2 are distributed uniformly, and the centers of the third sub-pixels 3 in the second display sub-area A2 are distributed uniformly.

Optionally in the display panel according to an embodiment of this disclosure, sub-pixels with a same color among the first sub-pixels, the second sub-pixels, and the third sub-pixels in the second display sub-area are arranged at a uniform interval in the row direction, and arranged at a uniform interval in the column direction. As illustrated in FIG. 2 to FIG. 7, for example, the first sub-pixels 1 in the second display sub-area A2 are arranged at a uniform interval in the row direction, and arranged at a uniform interval in the column direction, the second sub-pixels 2 in the second display sub-area A2 are arranged at a uniform interval in the row direction, and arranged at a uniform interval in the column direction, and the third sub-pixels 3 in the second display sub-area A2 are arranged at a uniform interval in the row direction, and arranged at a uniform interval in the column direction.

Optionally in the display panel according to an embodiment of this disclosure, sub-pixels with a same color among the first sub-pixels, the second sub-pixels, and the third sub-pixels in the second display sub-area are arranged in different columns in adjacent rows, and there is the same distance between the centers of two adjacent sub-pixels in the same row, and the center of the same sub-pixel the most proximate thereto in an adjacent row. As illustrated in FIG. 2 to FIG. 7, for example, the first sub-pixels 1 in the second display sub-area A2 are arranged in different columns in adjacent rows, and there is the same distance between the centers of two adjacent first sub-pixels 1 in the same row, and the center of the same first sub-pixel 1 the most proximate thereto in an adjacent row. The same will apply to the other sub-pixels, so a repeated description thereof will be omitted here.

Optionally in the display panel according to an embodiment of this disclosure, sub-pixels with a same color among the first sub-pixels, the second sub-pixels, and the third sub-pixels in the second display sub-area are arranged in different rows in adjacent columns, and there is the same distance between the centers of two adjacent sub-pixels in the same column, and the center of the same sub-pixel the most proximate thereto in an adjacent column. As illustrated in FIG. 2 to FIG. 7, for example, the first sub-pixels 1 in the second display sub-area A2 are arranged in different rows in adjacent columns, and there is the same distance between the centers of two adjacent first sub-pixels 1 in the same column, and the center of the same first sub-pixel 1 the most proximate thereto in an adjacent column. The same will apply to the other sub-pixels, so a repeated description thereof will be omitted here.

Optionally in the display panel according to an embodiment of this disclosure, as illustrated in FIG. 2, FIG. 3, and FIG. 5 to FIG. 7, sub-pixels in the same column of third pixel elements 30 in the second display sub-area A2 are arranged in the same pattern. In this way, there is the same arrangement pattern of each column of third pixel elements 30 in the column direction so that an image can be displayed uniformly.

Optionally in the display panel according to an embodiment of this disclosure, as illustrated in FIG. 4, sub-pixels in two adjacent third pixel elements 30 in the same column in the second display sub-area A2 can alternatively be arranged in reverse patterns. Taking the first row of third pixel elements 30, and the second row of third pixel elements 30 in the same column as an example, the third sub-pixels 30, the first sub-pixels 1, and the second sub-pixels 2 in the first row of third pixel elements 30 are arranged in a triangular pattern, and the first sub-pixels 1, the third sub-pixels 30, and the second sub-pixels 2 in the second row of third pixel elements 30 are arranged in a triangular pattern.

Optionally in the display panel according to an embodiment of this disclosure, as illustrated in FIG. 2 to FIG. 7, the distance between the centers of the second sub-pixel 2 and the first sub-pixel 1 is equal to the distance between the centers of the second sub-pixel 2 and the third sub-pixel 3 in each third pixel element 30 in the second display sub-area A2, that is, an isosceles triangle is defined by the center of the second sub-pixel 2, the center of the first sub-pixel 1, and the center of the third sub-pixel 3 in the third pixel element 30 so that the center of light emission by the third pixel element 30 lies onto the center of the isosceles triangle.

Optionally in the display panel according to an embodiment of this disclosure, as illustrated in FIG. 2 to FIG. 7, for two adjacent third pixel elements 30 in the row direction in the second display sub-area A2, the first sub-pixel 1 and the third sub-pixel 3 in one of the third pixel elements 30 are located in the same row as the second sub-pixel 2 in the other third pixel element 30, so that in order to display an image, the number of pixels in the second display sub-area A2 is equal to the number of third pixel elements 30, that is, a physical resolution of the pixels in the second display sub-area A2 is a display resolution thereof. Furthermore in the second display sub-area A2, three sub-pixels in each third pixel element 30 are arranged in a triangular pattern; and of two adjacent third pixel elements 30 in the row direction, one of the third pixel elements is an upside-down triangle, and the other third pixel element is a triangle, so that such a situation can be avoided that there are a large number of sub-pixels in some rows, and a small number of sub-pixels in the other rows in the second display sub-area A2, to thereby avoid an image from being displayed non-uniformly.

Optionally in the display panel according to an embodiment of this disclosure, as illustrated in FIG. 3 to FIG. 7, the respective sub-pixels in the second display sub-area A2 are arranged uniformly in a tessellated pattern.

Optionally in the display panel according to an embodiment of this disclosure, as illustrated in FIG. 4, in the same third pixel element 30 in the second display sub-area A2, an orthographical projection of the center of the second sub-pixel 2 onto the line connecting the center of the first sub-pixel 1 with the center of the third sub-pixel 3 lies between the center of the first sub-pixel 1, and the center of the third sub-pixel 3. For example, the orthographical projection of the center of the second sub-pixel 2 onto the line L1 connecting the center of the first sub-pixel 1 with the center of the third sub-pixel 3 lies onto the intersection between the connecting line L1 and the straight line L2. In this way, the distance between the center of the second sub-pixel 2, and the center of the first sub-pixel 1 in the third pixel element 30 can be equal to the distance between the center of the second sub-pixel 2, and the center of the third sub-pixel 3 so that these three sub-pixels are arranged in an isosceles triangle pattern to thereby avoid vertical bright and dark strips from occurring in the second display sub-area A2.

In a particular implementation, the distance between the center of the second sub-pixel, and the center of the first sub-pixel may not be exactly equal to the distance between the center of the second sub-pixel, and the center of the third sub-pixel, and there may be some error due to a limiting process condition or another factor, e.g., an arrangement of wires or through-holes, in a real process, so the shapes and the positions of the respective sub-pixels, and their relative positional relationship can substantially satisfy the condition above without departing from the scope of this disclosure.

Optionally in the display panel according to an embodiment of this disclosure, as illustrated in FIG. 2 to FIG. 5, and FIG. 7, sub-pixels with a same color in adjacent third pixel elements 30 in the row direction are not adjacent to each other, that is, of two adjacent third pixel elements 30 in the row direction, the first sub-pixel 1 in one of the third pixel elements 30 is not adjacent to the first sub-pixel 1 in the other third pixel element 30. In this way, a color crosstalk can be avoided from occurring due to the same color of two adjacent columns of sub-pixels in the second display sub-area A2. Of course, as illustrated in FIG. 6, sub-pixels with a same color in adjacent third pixel elements 30 in the row direction can alternatively be adjacent to each other, that is, of two adjacent third pixel elements 30 in the row direction, the third sub-pixel 3 in one of the third pixel elements 30 is adjacent to the third sub-pixel 3 in the other third pixel element 30.

Optionally in the display panel according to an embodiment of this disclosure, as illustrated in FIG. 2 to FIG. 7, there is substantially the same light-emission area of a first sub-pixel 1, a second sub-pixel 2, and a third sub-pixel 3 in the second display sub-area A2 so that light can be emitted uniformly. Of course, in a particular implementation, since there are different light-emission efficiencies of different sub-pixels, alternatively there may be different light-emission areas of a first sub-pixel 1, a second sub-pixel 2, and a third sub-pixel 3 in the second display sub-area A2 so that light can be emitted uniformly, although an embodiment of this disclosure will not be limited thereto.

Optionally in the display panel according to an embodiment of this disclosure, as illustrated in FIG. 2 to FIG. 7, there is substantially the same shape of a first sub-pixel 1, a second sub-pixel 2, and a third sub-pixel 3 in the second display sub-area A2. In this way, the difficulty of a fabrication process can be lowered.

Optionally in the display panel according to an embodiment of this disclosure, as illustrated in FIG. 2 to FIG. 7, the first display sub-area A1 can include a plurality of first pixel elements 10 and second pixel elements 20 arranged adjacent to each other, where each first pixel element 10 includes a first sub-pixel 1 and a second sub-pixel 2, and each second pixel element 20 includes a third sub-pixel 3 and a second sub-pixel 2. In order to display an image, the number of pixels in the first display sub-area A1 is equal to the sum of the number of first pixel elements 10, and the number of second pixel elements 20, that is, the pixels are arranged in a pen tile pattern in the first display sub-area A1, and the image can be displayed at the pixel elements at a higher resolution than a physical resolution by borrowing the sub-pixels in their adjacent pixel elements.

In a particular implementation, in the display panel according to an embodiment of this disclosure, two adjacent pixel elements refer to two pixel elements between which there is not any other pixel element, and two adjacent sub-pixels refer to two sub-pixels between which there is not any other sub-pixel.

It shall be noted that in the display panel according to an embodiment of this disclosure, since there is a limited space at the edge of a display sub-area, the arrangement of sub-pixels in the first display sub-area, and the arrangement of sub-pixels in the second display sub-area generally refer to the arrangements of sub-pixels inside the display sub-areas, and there may be a different arrangement of some sub-pixels at the edge of the display sub-area, although an embodiment of this disclosure will not be limited thereto.

In a particular implementation, the first sub-pixels, the second sub-pixels, and the third sub-pixels are generally one of red, green, and blue sub-pixels respectively. Optionally in the display panel according to an embodiment of this disclosure, the second sub-pixels are green sub-pixels, the first sub-pixels are red or blue sub-pixels, and the third sub-pixels are blue or red sub-pixels.

It shall be noted that in the display panel according to an embodiment of this disclosure, the center of a sub-pixel refers to the center of a light-emitting area of the sub-pixel. Taking an Organic Light-Emitting Diode (OLED) display panel as an example, a sub-pixel generally includes an anode layer, a light-emitting layer, and a cathode layer structured in a stack, where in order to display an image, a light-emitting area corresponding to the stack structure is the light-emitting area of the sub-pixel, so that the area occupied by the light-emitting area is a light-emitting area. Of course, the light-emitting area can alternatively be an area occupied by an opening area defined by a pixel definition layer, for example, although an embodiment of this disclosure will not be limited thereto.

In a particular implementation, in the display panel according to an embodiment of this disclosure, as illustrated in FIG. 2 to FIG. 7, the first pixel elements 10 and the second pixel elements 20 in the first display sub-area A1 can be arranged in any pen tile pattern, although an embodiment of this disclosure will not be limited thereto.

Optionally in the display panel according to an embodiment of this disclosure, as illustrated in FIG. 2 to FIG. 7, the first pixel elements 10 and the second pixel elements 20 are arranged alternately in the column direction, and the first pixel elements 10 and the second pixel elements 20 are arranged alternately in the row direction, in the first display sub-area A1.

Optionally in the display panel according to an embodiment of this disclosure, as illustrated in FIG. 2 and FIG. 3, in the first display sub-area A1, the second sub-pixel 2 and the first sub-pixel 1 in each first pixel element 10 are arranged in the same row, and the second sub-pixel 2 and the third sub-pixel 3 in each second pixel element 20 are arranged in the same row; and for the first pixel element 10 and the second pixel element 20 adjacent in the row direction, the second sub-pixel 2 in the first pixel element 10 is not adjacent to the second sub-pixel 2 in the second pixel element 20. For example, for the first pixel element 10 and the second pixel element 20 adjacent in the row direction, the second sub-pixel 2 in the first pixel element 10 is spaced from the second sub-pixel 2 in the second pixel element 20 by the third sub-pixel 3, although an embodiment of this disclosure will not be limited thereto.

Optionally in the display panel according to an embodiment of this disclosure, as illustrated in FIG. 2 and FIG. 3, a light-emitting area of a first sub-pixel 1, a light-emitting area of a second sub-pixel 2, and a light-emitting area of a third sub-pixel 3 can be substantially the same in the first display sub-area A1.

Furthermore in the display panel according to an embodiment of this disclosure, as illustrated in FIG. 2 and FIG. 3, for respective first pixel elements 10 and respective second pixel elements 20 in the same column, the second sub-pixels 2 in the respective first pixel elements 10 are located in the same column as the second sub-pixels 2 in the respective second pixel elements 20. For example, the second sub-pixels 2 in the respective first pixel elements 10 in the first column are located in the same column as the second sub-pixels 2 in the respective second pixel elements 20 in the first column.

Furthermore in the display panel according to an embodiment of this disclosure, as illustrated in FIG. 2 and FIG. 3, there may be substantially the same shape of a first sub-pixel 1, a second sub-pixel 2, and a third sub-pixel 3 in the first display sub-area A1. Optionally the shape of the first sub-pixels 1 in the first display sub-area A1 can be a rectangle. Optionally the shape of the second sub-pixels 2 in the first display sub-area A1 can be a rectangle. Optionally the shape of the third sub-pixels 3 in the first display sub-area A1 can be a rectangle.

Optionally in the display panel according to an embodiment of this disclosure, as illustrated in FIG. 4 to FIG. 7, in the first display sub-area A1, the second sub-pixel 2 and the first sub-pixel 1 in each first pixel element 10 are arranged in the same row, and the second sub-pixel 2 and the third sub-pixel 3 in each second pixel element 20 are arranged in different rows and in different columns; and two second sub-pixels 2 in the first pixel element 10 and the second pixel element 20 adjacent in the row direction are not adjacent to each other. The first pixel element 10 and the second pixel element 20 adjacent in the column direction are a group of pixels 100, and in the same group of pixels 100, the second sub-pixel 2 in the first pixel element 10 is located in the same column as the second sub-pixel 2 in the second pixel element 20, that is, two adjacent rows of pixel elements are spaced from each other in the column direction by a half of a column.

Furthermore in the display panel according to an embodiment of this disclosure, as illustrated in FIG. 4 to FIG. 7, in the same group of pixels 100, two second sub-pixels 2 are arranged adjacent to each other in the column direction, and symmetric in the row direction even if they are arranged in a mirrored pattern. Furthermore, in the first display sub-area A1, when the second sub-pixels 2 are green sub-pixels, the total light-emitting area of two second sub-pixels 2 is smaller than a light-emitting area of a first sub-pixel 1, and the total light-emitting area of two second sub-pixels 2 is smaller than a light-emitting area of a third sub-pixel 3, because the green sub-pixels have a higher light-emission efficiency than those of the sub-pixels in the other colors.

Optionally in the display panel according to an embodiment of this disclosure, as illustrated in FIG. 4 to FIG. 7, two adjacent second sub-pixels 2 in the column direction in the first display sub-area A1 are a group of second sub-pixels 200, and the distance between two adjacent groups of second sub-pixels 200 in the column direction in the first display sub-area A1 is equal to the distance between two adjacent second sub-pixels 200 in the column direction in the second display sub-area A2.

Optionally in the display panel according to an embodiment of this disclosure, as illustrated in FIG. 4 to FIG. 7, the shapes of the first sub-pixel 1 and the third sub-pixel 3 are the same, and the shape of a combination of two adjacent second sub-pixels 2 in the column direction is the same as the shape of the first sub-pixel 1, in the same group of pixels 100.

Optionally in the display panel according to an embodiment of this disclosure, as illustrated in FIG. 4 to FIG. 7, as illustrated in FIG. 4 to FIG. 7, in the first display sub-area A1, both the shape of the first sub-pixels 1, and the shape of the third sub-pixels 3 are a hexagon, and the shape of the second sub-pixels 2 is a pentagon, so that the shape of a combination of two adjacent second pentagons 2 in the column direction can be a hexagon.

Particularly in the display panel according to an embodiment of this disclosure, the shapes of the first sub-pixels, the second sub-pixels, and the third sub-pixels in the first display sub-area will not be limited to any particular shapes, and may be regular or irregular shapes. In a particular implementation, a regular shape is generally easy to form from the perspective of a process.

Particularly in the display panel according to an embodiment of this disclosure, the shapes of the first sub-pixels, the second sub-pixels, and the third sub-pixels in the second display sub-area will not be limited to any particular shapes, and may be regular or irregular shapes. In a particular implementation, a regular shape is generally easy to form from the perspective of a process.

Optionally in the display panel according to an embodiment of this disclosure, the spacing between two adjacent first sub-pixels in the column direction in the first display sub-area is not larger than the spacing between two adjacent first sub-pixels in the column direction in the second display sub-area, and the spacing between two adjacent third sub-pixels in the column direction in the first display sub-area is not larger than the spacing between two adjacent third sub-pixels in the column direction in the second display sub-area. As illustrated in FIG. 2, FIG. 3, and FIG. 5 to FIG. 7, for example, the spacing between two adjacent first sub-pixels 1 in the column direction in the first display sub-area A1 is substantially equal to the spacing between two adjacent first sub-pixels 1 in the column direction in the second display sub-area A2, and the spacing between two adjacent third sub-pixels 3 in the column direction in the first display sub-area A1 is substantially equal to the spacing between two adjacent third sub-pixels 3 in the column direction in the second display sub-area A2. As illustrated in FIG. 4, the spacing between two adjacent first sub-pixels 1 in the column direction in the first display sub-area A1 is smaller than the spacing between two adjacent first sub-pixels 1 in the column direction in the second display sub-area A2, and the spacing between two adjacent third sub-pixels 3 in the column direction in the first display sub-area A1 is smaller than the spacing between two adjacent third sub-pixels 3 in the column direction in the second display sub-area A2.

Optionally in the display panel according to an embodiment of this disclosure, a light-emitting area of a second sub-pixel in the second display sub-area is not smaller than a light-emitting area of a second sub-pixel in the first display sub-area, a light-emitting area of a first sub-pixel in the second display sub-area is substantially equal to a light-emitting area of a first sub-pixel in the first display sub-area, and a light-emitting area of a third sub-pixel in the second display sub-area is substantially equal to a light-emitting area of a third sub-pixel in the first display sub-area. As illustrated in FIG. 2 and FIG. 3, for example, a light-emitting area of a second sub-pixel 2 in the second display sub-area A2 is substantially equal to a light-emitting area of a second sub-pixel 2 in the first display sub-area A1, a light-emitting area of a first sub-pixel 1 in the second display sub-area A2 is substantially equal to a light-emitting area of a first sub-pixel 1 in the first display sub-area A1, and a light-emitting area of a third sub-pixel 3 in the second display sub-area A2 is substantially equal to a light-emitting area of a third sub-pixel 3 in the first display sub-area A1. As illustrated in FIG. 4 to FIG. 7, a light-emitting area of a second sub-pixel 2 in the second display sub-area A2 is larger than a light-emitting area of a second sub-pixel 2 in the first display sub-area A1, a light-emitting area of a first sub-pixel 1 in the second display sub-area A2 is substantially equal to a light-emitting area of a first sub-pixel 1 in the first display sub-area A1, and a light-emitting area of a third sub-pixel 3 in the second display sub-area A2 is substantially equal to a light-emitting area of a third sub-pixel 3 in the first display sub-area A1.

Optionally in the display panel according to an embodiment of this disclosure, as illustrated in FIG. 2 to FIG. 7, the shape of the first sub-pixels 1 in the second display sub-area A2 are substantially the same as the shape of the first sub-pixels 1 in the first display sub-area A1, and the shape of the third sub-pixels 3 in the second display sub-area A2 are substantially the same as the shape of the third sub-pixels 3 in the first display sub-area A1. In this way, the difficulty of a fabrication process can be lowered.

Optionally in the display panel according to an embodiment of this disclosure, as illustrated in FIG. 2 to FIG. 7, a light-emitting area of a first sub-pixel 1 is substantially equal to a light-emitting area of a third sub-pixel 3, in the first display sub-area A1.

Optionally in the display panel according to an embodiment of this disclosure, in the first display sub-area, a light-emitting area of a second sub-pixel is not larger than a light-emitting area of a first sub-pixel, and a light-emitting area of a second sub-pixel is not larger than a light-emitting area of a third sub-pixel. As illustrated in FIG. 2 and FIG. 3, for example, in the first display sub-area A1, a light-emitting area of a second sub-pixel 2 is substantially equal to a light-emitting area of a first sub-pixel 1, and a light-emitting area of a second sub-pixel 2 is substantially equal to a light-emitting area of a third sub-pixel 3. As illustrated in FIG. 4 to FIG. 7, in the first display sub-area A1, a light-emitting area of a second sub-pixel 2 is smaller than a light-emitting area of a first sub-pixel 1, and a light-emitting area of a second sub-pixel 2 is smaller than a light-emitting area of a third sub-pixel 3.

Optionally in the display panel according to an embodiment of this disclosure, as illustrated in FIG. 2 and FIG. 3, the sub-pixels in the second display sub-area A2 can be located in the same row as a part of the sub-pixels in the first display sub-area A1, that is, the sub-pixels in the second display sub-area A2 correspond to the sub-pixels in the first display sub-area A1 in the row direction instead of being arranged in different rows so that the sub-pixels in the second display sub-area A2, and the sub-pixels in the first display sub-area A1 are consistent with each other in the row direction to thereby facilitate wiring in the display substrate.

Optionally in the display panel according to an embodiment of this disclosure, as illustrated in FIG. 2 and FIG. 3, the sub-pixels in the second display sub-area A2 can be located in the same column as a part of the sub-pixels in the first display sub-area A1, that is, the sub-pixels in the second display sub-area A2 correspond to the sub-pixels in the first display sub-area A1 in the column direction instead of being arranged in different columns so that the sub-pixels in the second display sub-area A2, and the sub-pixels in the first display sub-area A1 are consistent with each other in the column direction to thereby facilitate wiring in the display substrate.

Optionally in the display panel according to an embodiment of this disclosure, the first sub-pixels in the second display sub-area, and the first sub-pixels in the first display sub-area are located in at least one of the same row and the same column. As illustrated in FIG. 6 and FIG. 7, for example, the first sub-pixels in the second display sub-area A2 and the first sub-pixels in the first display sub-area A1 are located in the same column so that the first sub-pixels in the second display sub-area A2 and the first sub-pixels in the first display sub-area A1 are consistent with each other in the column direction. As illustrated in FIG. 2 and FIG. 3, the first sub-pixels in the second display sub-area A2 and the first sub-pixels in the first display sub-area A1 are located in the same row so that the first sub-pixels in the second display sub-area A2 and the first sub-pixels in the first display sub-area A1 are consistent with each other in the row direction. Of course, the first sub-pixels in the second display sub-area A2 and the first sub-pixels in the first display sub-area A1 can be located in the same row, and the first sub-pixels in the second display sub-area A2 and the first sub-pixels in the first display sub-area A1 can be located in the same column.

Optionally in the display panel according to an embodiment of this disclosure, the second sub-pixels in the second display sub-area, and the second sub-pixels in the first display sub-area are located in at least one of the same row and the same column. As illustrated in FIG. 2 and FIG. 3, for example, the second sub-pixels 2 in the second display sub-area A2 are located in the same row as the second sub-pixels 2 in the first display sub-area A1. As illustrated in FIG. 4 to FIG. 7, the second sub-pixels 2 in the second sub-area A2 are located in the same column as the second sub-pixels 2 in the first display sub-area A1, so that the second sub-pixels 2 in the second display sub-area A2, and the second sub-pixels 2 in the first display sub-area A1 are consistent with each other in the column direction. However since the second sub-pixels 2 are the centers of the light-emitting pixels in the pixel elements in the display substrate, the centers of the light-emitting pixels in the second display sub-area, and the centers of the light-emitting pixels in the first display sub-area can are consistent with each other in the row direction. Of course, alternatively the second sub-pixels in the second display sub-area can be located in the same column as the second sub-pixels in the first display sub-area, and the second sub-pixels in the second display sub-area can be located in the same row as the second sub-pixels in the first display sub-area.

Optionally in the display panel according to an embodiment of this disclosure, the third sub-pixels in the second display sub-area, and the third sub-pixels in the first display sub-area are located in at least one of the same row and the same column. As illustrated in FIG. 6 and FIG. 7, for example, the third sub-pixels 3 in the second display sub-area A2 are located in the same column as the third sub-pixels 3 in the first display sub-area A1, so that the third sub-pixels 3 in the second display sub-area A2, and the third sub-pixels 3 in the first display sub-area A1 are consistent with each other in the column direction. As illustrated in FIG. 2 and FIG. 3, the third sub-pixels 3 in the third sub-area A2 are located in the same row as the third sub-pixels 3 in the first display sub-area A1, so that the third sub-pixels 3 in the second display sub-area A2, and the third sub-pixels 3 in the first display sub-area A1 are consistent with each other in the row direction. Alternatively the third sub-pixels in the second display sub-area can be located in the same column as the third sub-pixels in the first display sub-area, and the third sub-pixels in the second display sub-area can be located in the same row as the third sub-pixels in the first display sub-area.

Figure 5:
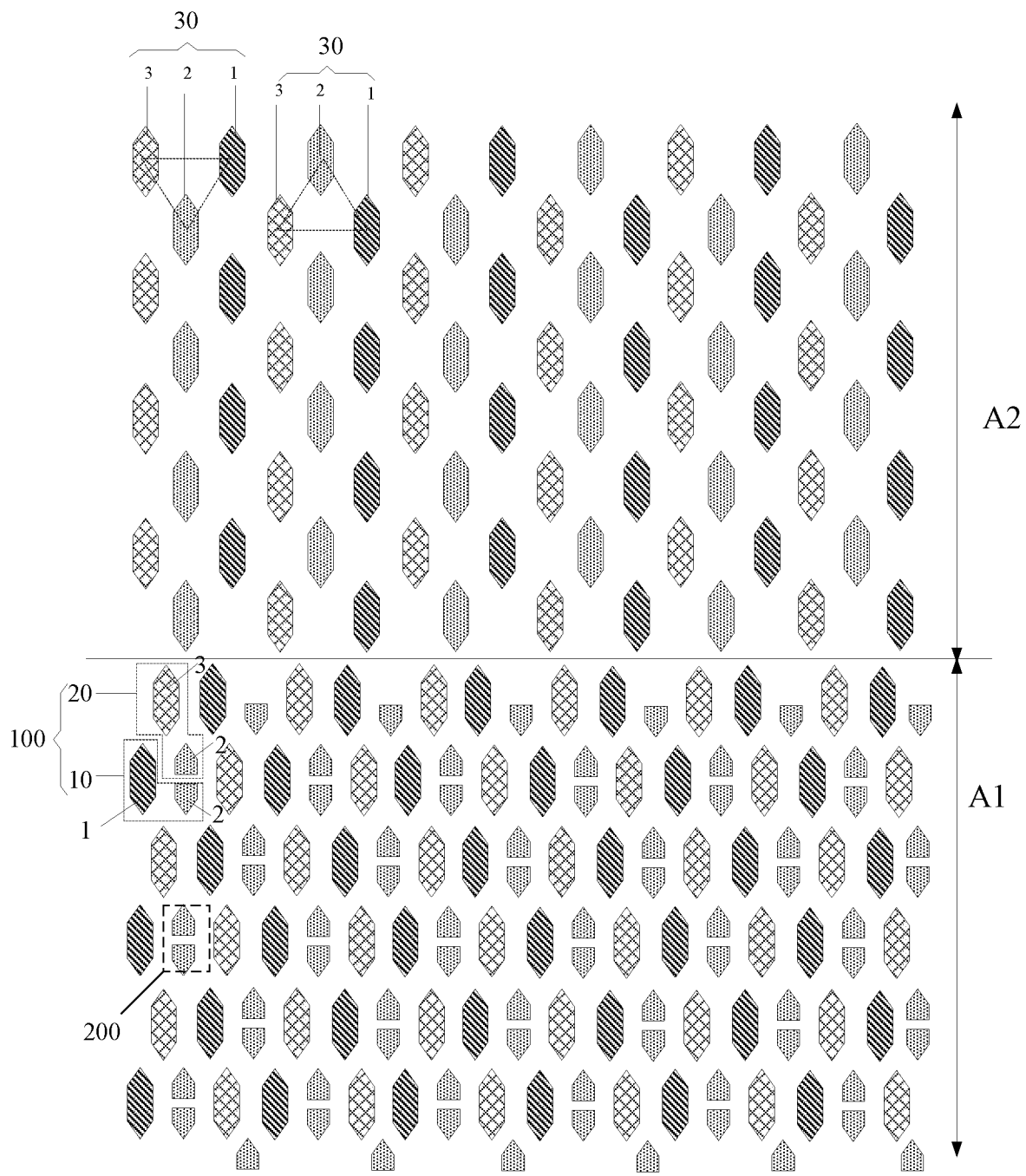
FIG. 5 is a fourth schematic structural diagram of a part of the first display sub-area and the second display sub-area in the display panel according to an embodiment of this disclosure.
Figure 6:
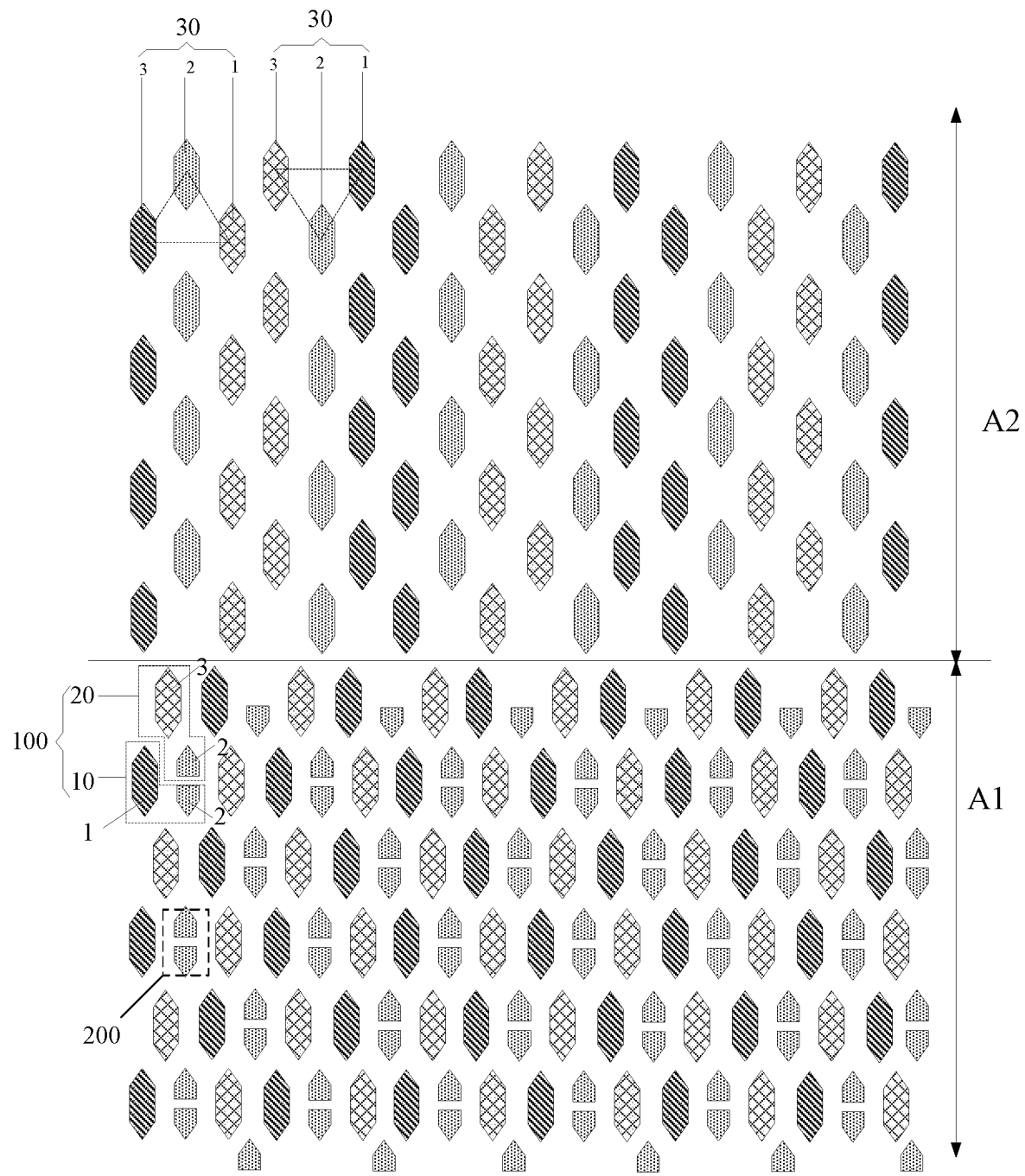
FIG. 6 is a fifth schematic structural diagram of a part of the first display sub-area and the second display sub-area in the display panel according to an embodiment of this disclosure.
Figure 7:
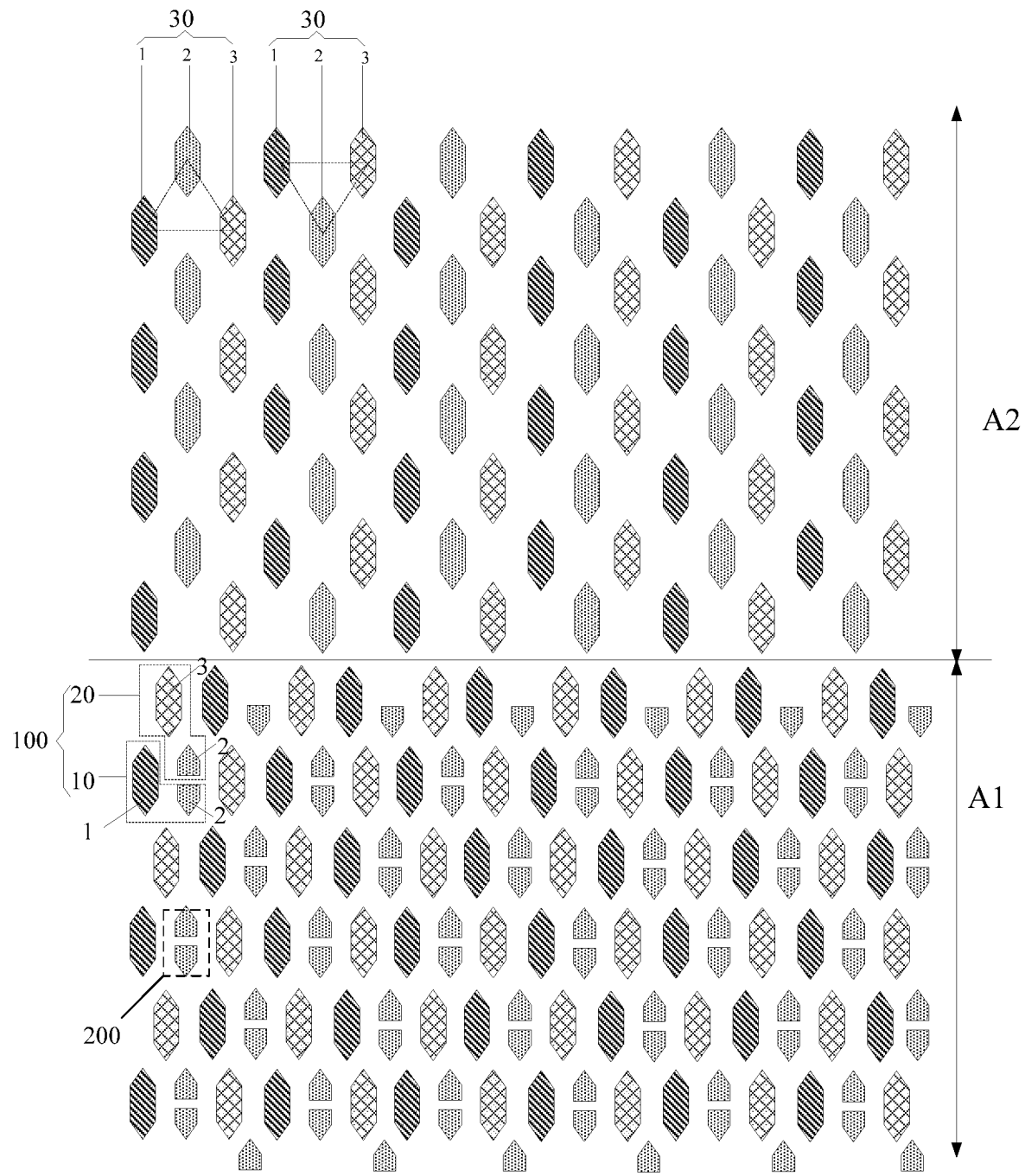
FIG. 7 is a sixth schematic structural diagram of a part of the first display sub-area and the second display sub-area in the display panel according to an embodiment of this disclosure.

Optionally in the display panel according to an embodiment of this disclosure, as illustrated in FIG. 5 to FIG. 7, the spacing between two adjacent first sub-pixels 1 in the column direction in the first display sub-area A1 is equal to the spacing between two adjacent first sub-pixels 1 in the column direction in the second display sub-area A2.

The spacing between two adjacent third sub-pixels 3 in the column direction in the first display sub-area A1 is equal to the spacing between two adjacent third sub-pixels 3 sub-pixels 1 in the column direction in the second display sub-area A2.

Two adjacent second sub-pixels 2 in the column direction in the first display sub-area A1 is a group of second sub-pixels 200, and the distance between two adjacent groups of second sub-pixels 200 in the column direction in the first display sub-area A1 is equal to the distance between two adjacent second sub-pixels 2 in the column direction in the second display sub-area A2.

Optionally in the display panel according to an embodiment of this disclosure, as illustrated in FIG. 4 to FIG. 7, the distribution density of the first sub-pixels 1 in the second display sub-area A2 in the row direction is approximately ½ of the distribution density of the first sub-pixels 1 in the first display sub-area A1 in the row direction, or alternatively there may be another ratio, e.g., ⅓, ¼, etc, although an embodiment of this disclosure will not be limited thereto.

The distribution density of the third sub-pixels 3 in the second display sub-area A2 in the row direction is approximately ½ of the distribution density of the third sub-pixels 3 in the first display sub-area A1 in the row direction, or alternatively there may be another ratio, e.g., ⅓, ¼, etc, although an embodiment of this disclosure will not be limited thereto.

The distribution density of the second sub-pixels 2 in the second display sub-area A2 in the row direction is approximately ¼ of the distribution density of the second sub-pixels 2 in the first display sub-area A1 in the row direction, or alternatively there may be another ratio, e.g., ⅙, ⅑, etc, although an embodiment of this disclosure will not be limited thereto.

It shall be noted that the row direction here refers to a row of pixels in a unit, for example. Moreover the ratio of the densities in an embodiment of this disclosure refers to a general range of ratios, and in a particular implementation, the ratio of the densities may not be an integer.

Optionally in the display panel according to an embodiment of this disclosure, as illustrated in FIG. 4 to FIG. 7, a light-emitting area of a second sub-pixel 2 is smaller than a light-emitting area of a first sub-pixel 1, and a light-emitting area of a second sub-pixel 2 is smaller than a light-emitting area of a third sub-pixel 3, in the first display sub-area A1. Since the number of first sub-pixels 1 is the same as the number of third sub-pixels 3, and the number of second sub-pixels 2 is twice the number of first sub-pixels 1, in the first display sub-area A1, a light-emitting area of a second sub-pixel 2 can be made smaller.

It shall be noted that sub-pixels in the same shape refer to sub-pixels including light-emitting areas in similar shapes, and with the same or different areas. A light-emitting area of a sub-pixel can be set according to light-emission efficiency of the sub-pixel, although an embodiment of this disclosure will not be limited thereto.

It shall be noted that in the display panel according to an embodiment of this disclosure, the shape of a sub-pixel refers to the shape of a light-emitting area of the sub-pixel.

In a particular implementation, in the display panel according to an embodiment of this disclosure, as illustrated in FIG. 4 to FIG. 7, when the second sub-pixels 2 in the first display sub-area A1 are green sub-pixels, a light-emitting area of two second sub-pixels 2 is smaller than a light-emitting area of a first sub-pixel 1, and a light-emitting area of two second sub-pixels 2 is smaller than a light-emitting area of a third sub-pixel 3 because the green sub-pixels have higher light-emission efficiency than that of the sub-pixels in the other colors.

Based upon the same inventive idea, an embodiment of this disclosure further provides a display device including the display substrate according to any one of an embodiments above of this disclosure. The display device can be a mobile phone, a tablet computer, a TV set, a monitor, a notebook computer, a digital photo frame, a navigator, or any other product or component with a display function. Reference can be made to an embodiment of the display substrate above for an implementation of the display device, and a repeated description thereof will be omitted here.

Based upon the same inventive idea, an embodiment of this disclosure further provides a fine metal mask for fabricating the display substrate according to any one of an embodiments of this disclosure, where the fine metal mask includes a plurality of opening areas corresponding in shape and position to the first sub-pixels, the second sub-pixels, or the third sub-pixels.

Figure 8:
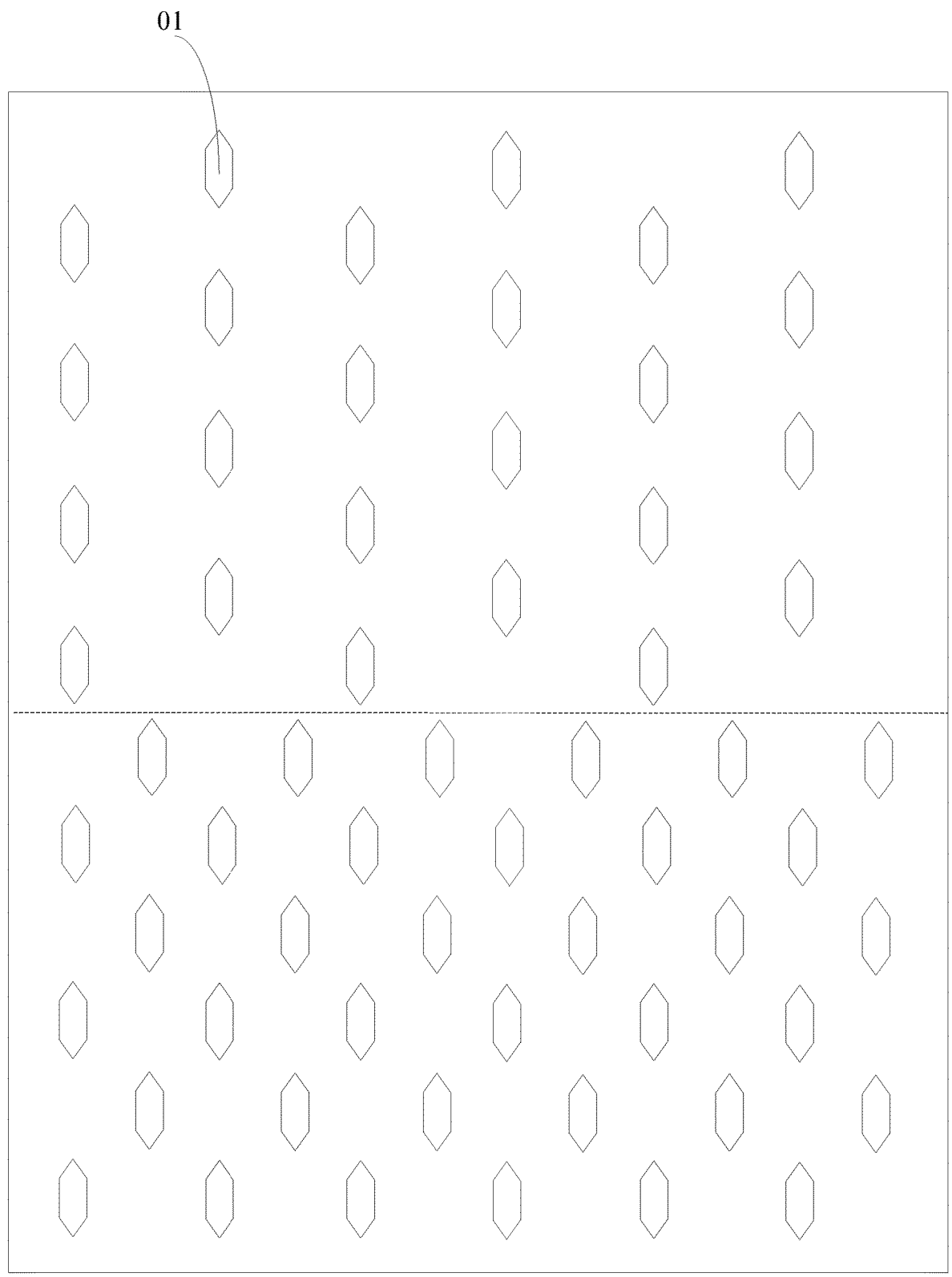
FIG. 8 is a schematic structural diagram of a fine metal mask according to an embodiment of this disclosure.

In a particular implementation, each sub-pixel generally includes an anode layer, a light-emitting layer, and a cathode layer, where the light-emitting layer is generally vapor-plated using the fine metal mask above. Taking the display substrate as illustrated in FIG. 7 as an example, the fine metal mask for forming the first sub-pixels includes opening areas 01 corresponding in shape and position to the light-emitting layers of the first substrate 1 in the display substrate as illustrated in FIG. 8. The area of an opening area 01 is generally larger than an area of a corresponding light-emitting area due to a limiting process factor. Principles of fine metal mask for forming the second sub-pixels, and the fine metal mask for forming the third sub-pixels are similar to the principle of the fine metal mask for forming the first sub-pixels, so a repeated description thereof will be omitted here.

Figure 9:
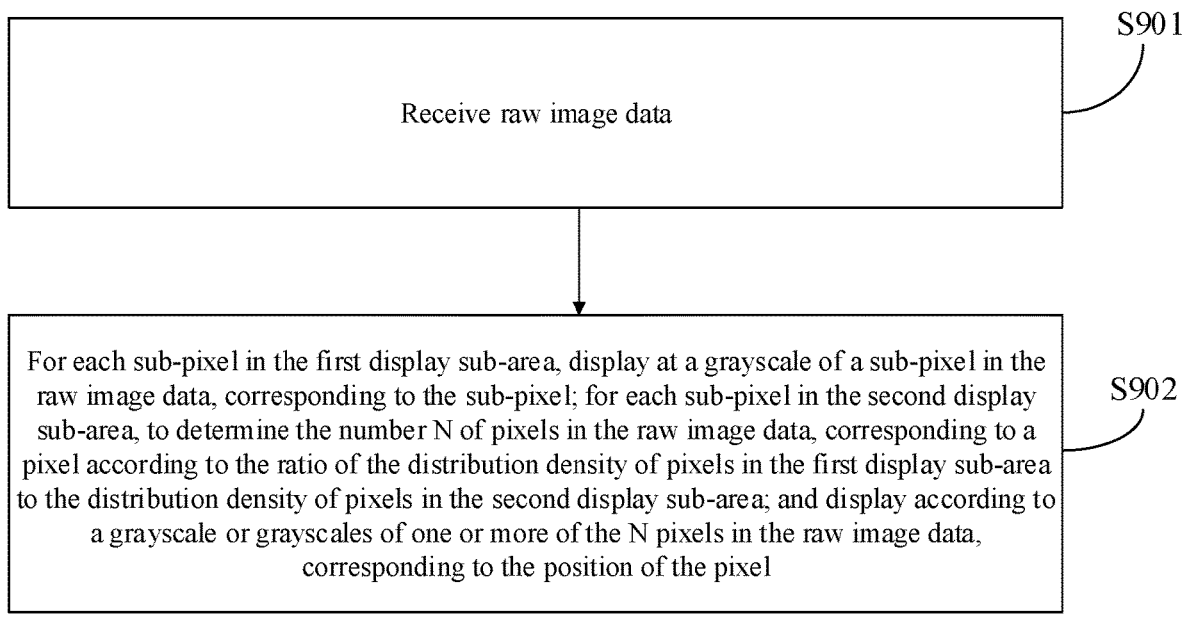
FIG. 9 is a schematic flow chart of a display method according to an embodiment of this disclosure.

Based upon the same inventive idea, an embodiment of this disclosure further provides a method for driving the display substrate according to any one of the embodiments above of this disclosure, and as illustrated in FIG. 9, the method includes the following steps:

the step S901 is to receive raw image data; and the step S902 is, for each sub-pixel in the first display sub-area, to display at a grayscale of a sub-pixel in the raw image data, corresponding to the sub-pixel; for each sub-pixel in the second display sub-area, to determine the number N of pixels in the raw image data, corresponding to a pixel according to the ratio of the distribution density of pixels in the first display sub-area to the distribution density of pixels in the second display sub-area; and to display according to a grayscale or grayscales of one or more of the N pixels in the raw image data, corresponding to the position of the pixel.

In a particular implementation, when the ratio of the distribution density of pixels in the first display sub-area to the distribution density of pixels in the second display sub-area is n, a pixel in the second display sub-area corresponds to four pixels in the raw image data, that is, N=n*n, as defined in the equation above of the distribution density of pixels.

Optionally in the method according to an embodiment of this disclosure, for a pixel in the second display sub-area, an image is displayed at an average grayscale of more than one of the N pixels in the raw image data, corresponding to the position of the pixel. For example, N=4, that is, each pixel in the second display sub-area corresponds to four pixels in the raw image data, so for each pixel in the second display sub-area, an image can be displayed at an average grayscale of k pixels among four pixels in the raw image data, corresponding to the pixel. With k=4, if a pixel in the second display sub-area includes a first sub-pixel, a second sub-pixel, and a third sub-pixel, then a display grayscale X1 corresponding to the first sub-pixel will be (x1+x2+x3+x4)/4, where x1 to x4 represent grayscales of respective first sub-pixels in four pixels in the raw image data, corresponding to the pixel in the second display sub-area respectively; a display grayscale Y1 corresponding to the second sub-pixel will be (y1+y2+y3+y4)/4, where y1 to y4 represent grayscales of respective second sub-pixels in four pixels in the raw image data, corresponding to the pixel in the second display sub-area respectively; and a display grayscale Z1 corresponding to the third sub-pixel will be (z1+z2+z3+z4)/4, where z1 to z4 represent grayscales of respective third sub-pixels in four pixels in the raw image data, corresponding to the pixel in the second display sub-area respectively.

Optionally in the method according to an embodiment of this disclosure, for a pixel in the second display sub-area, an image is displayed at a grayscale of the pixel at the highest brightness among the N pixels in the raw image data, corresponding to the position of the pixel.

Optionally in the method according to an embodiment of this disclosure, for a pixel in the second display sub-area, an image is displayed at a grayscale of a pixel at intermediate brightness among the N pixels in the raw image data, corresponding to the position of the pixel.

Optionally in the method according to an embodiment of this disclosure, for a pixel in the second display sub-area, an image is displayed according to the N pixels in the raw image data, corresponding to the position of the pixel, and a relative position relationship between the pixel in the second display sub-area, and the N pixels in the raw image data.

Alike N=4, for example, that is, each pixel in the second display sub-area corresponds to four pixels in the raw image data, and if the pixel in the second display sub-area includes a first sub-pixel, a second sub-pixel, and a third sub-pixel, then a display grayscale X1 corresponding to the first sub-pixel will be (k1*x1+k2*x2+k3*x3+k4*x4)/4, where x1 to x4 represent grayscales of respective first sub-pixels in four pixels in the raw image data, corresponding to the pixel in the second display sub-area respectively; a display grayscale Y1 corresponding to the second sub-pixel will be (k1*y1+k2*y2+k3*y3+k4*y4)/4, where y1 to y4 represent grayscales of respective second sub-pixels in four pixels in the raw image data, corresponding to the pixel in the second display sub-area respectively; and a display grayscale Z1 corresponding to the third sub-pixel will be (k1*z1+k2*z2+k3*z3+k4*z4)/4, where z1 to z4 represent grayscales of respective third sub-pixels in four pixels in the raw image data, corresponding to the pixel in the second display sub-area respectively, where k1 to k4 are weight coefficients determined according to the distances between the position of the pixel in the second display area, and the respective pixels among the four pixels in the raw image data, corresponding to the pixel so that there is a smaller weight coefficient for a longer distance.

Optionally in the method according to an embodiment of this disclosure, for a pixel in the second display sub-area, an image is displayed at a grayscale of the pixel at the highest brightness among the N pixels in the raw image data, corresponding to the position of the pixel.

For a pixel in the second display sub-area, an image is displayed at a grayscale of one of the N pixels in the raw image data, corresponding to the position of the pixel. The display principle complies with a constant quantity in a visual system of human eyes so that no flicker will occur, and it is not necessary to redesign any Integrated Circuit (IC), thus resulting in a low cost.

Optionally in the method according to an embodiment of this disclosure, the ratio of the distribution density of pixels in the first display sub-area to the distribution density in the second display sub-area is n, where n is an integer greater than 1.

Each pixel in the second display area corresponds to n*n pixels, arranged in a rectangular pattern, in the raw image data.

Optionally in the method according to an embodiment of this disclosure, generally n=2, that is, the distribution density of pixels in the first display sub-area is twice the distribution density of pixels in the second display sub-area. Of course, n can alternatively take another value in a real application, although an embodiment of this disclosure will not be limited thereto.

Optionally n=2, for example, and as illustrated in FIG. 10, each pixel in the second display area corresponds to pixels in two rows by two columns, arranged in a rectangular pattern, in the raw image data, and four pixels in a dotted box are pixels corresponding to a pixel in the second display area.

Optionally in the method according to an embodiment of this disclosure, for each pixel in the second display sub-area, a pixel at the same position among n*n pixel in the raw image data, corresponding to the pixel is a reference pixel, and an image is displayed at each pixel in the second display sub-area at the grayscale of the reference pixel corresponding to the pixel.

Figure 11D:
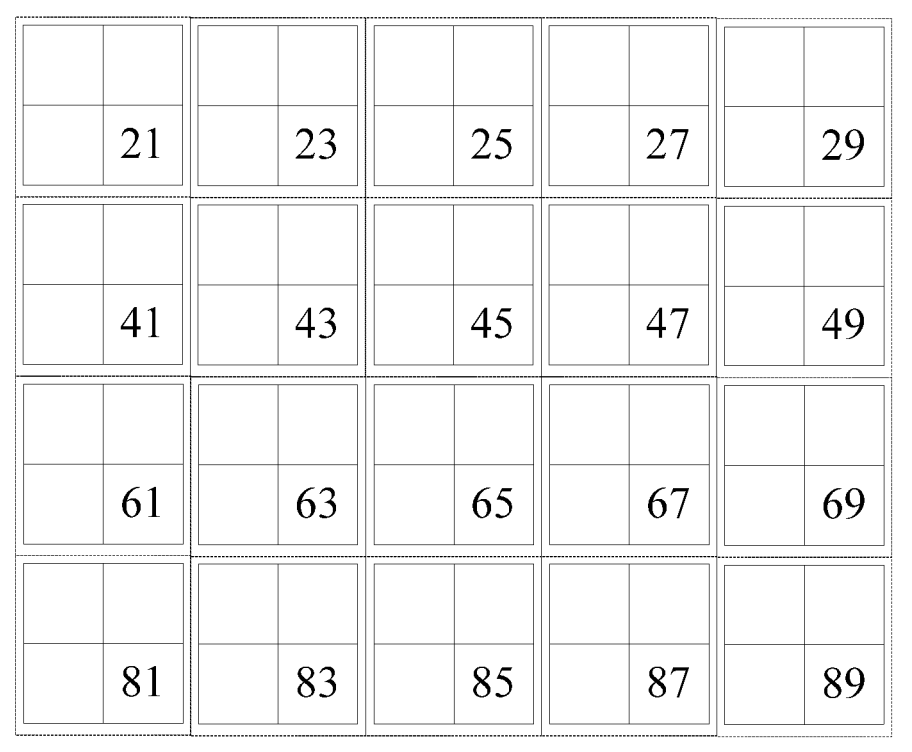

Alike n=2, for example, and as illustrated in FIG. 11a, for each pixel in the second display area, a pixel in the first row and in the first column among 2*2 pixels in the raw image data, corresponding to the pixel can be a reference pixel; or as illustrated in FIG. 11b, for each pixel in the second display area, a pixel in the first row and in the second column among 2*2 pixels in the raw image data, corresponding to the pixel can be a reference pixel; or as illustrated in FIG. 11a, for each pixel in the second display area, a pixel in the second row and in the first column among 2*2 pixels in the raw image data, corresponding to the pixel can be a reference pixel; or as illustrated in FIG. 11d, for each pixel in the second display area, a pixel in the second row and in the second column among 2*2 pixels in the raw image data, corresponding to the pixel can be a reference pixel.

In a particular implementation, in the method according to an embodiment of this disclosure, displaying at each pixel in the second display area at the grayscale of the reference pixel corresponding to the pixel particularly includes: displaying at the first sub-pixel at the grayscale of the first sub-pixel in the corresponding reference pixel, displaying at the second sub-pixel at the grayscale of the second sub-pixel in the corresponding reference pixel to the pixel, and displaying at the third sub-pixel at the grayscale of the third sub-pixel in the corresponding reference pixel to the pixel.

In a particular implementation, in the method according to an embodiment of this disclosure, the ratio of the distribution density of pixels in the first display sub-area to the distribution density of pixels in the second display sub-area may not be an integer, and for example, the ratio of the distribution density of pixels in the first display sub-area to the distribution density of pixels in the second display sub-area is m, where m=n+s, n is an integer more than or equal to 1, and s is a fraction between 0 and 1. Each pixel in the second display sub-area corresponds n*n pixels, arranged in a rectangular pattern, in the raw image data, or each pixel in the second display sub-area corresponds n*(n+1) pixels, arranged in a rectangular pattern, in the raw image data, or each pixel in the second display sub-area corresponds (n+1)*(n+1) pixels, arranged in a rectangular pattern, in the raw image data. A particular implementation principle thereof will be the same as that for m=n above, so a repeated description thereof will be omitted here.

In the method according to an embodiment of this disclosure, for a pixel in the first display sub-area, an image is displayed at the pixel at a grayscale of a pixel in the raw image data, corresponding to the pixel, and reference can be made to the prior art for a particular implementation thereof, so a repeated description thereof will be omitted here.

In a particular implementation, in the method according to an embodiment of this disclosure, an algorithm for determining the grayscales of the respective pixels according to the raw image data can be integrated in the IC, an externally connected Central Processing Unit (CPU), a micro-processor, etc., or a separately arranged driver connected with the respective pixels, although an embodiment of this disclosure will not be limited thereto.

In a particular implementation, in the method according to an embodiment of this disclosure, an image is displayed at the pixels on the display substrate at the grayscales of their corresponding pixels in the raw image data, and in order to optimize a display effect, the image can be displayed on the display screen only after being processed in an SPR or another image processing module, and in a Demura algorithm.

In the display substrate, the display method thereof, the display device, and the fine metal mask above according to the embodiments of this disclosure, the display area includes the first display sub-area with a high distribution density of pixels (i.e., a high resolution), and the second display sub-area with a low distribution density of pixels (i.e., a low resolution), and since the distribution density of pixels in the second display sub-area is low, a camera and another element can be arranged in the second display sub-area, that is, the distribution density of the local pixels can be lowered to thereby improve the transmittivity of a screen so as to improve a screen to panel ratio of the display substrate. The sub-pixels can be distributed uniformly in the second display sub-area to thereby guarantee uniform distribution of brightness in the second display sub-area.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A display substrate, comprising a display area comprising:
   a first display sub-area; and
   a second display sub-area, wherein a plurality of sub-pixels are uniformly distributed in the second display sub-area; and
   a distribution density of pixels in the first display sub-area is higher than a distribution density of pixels in the second display sub-area;
   wherein in case of that the first display sub-area comprises a plurality of first pixel elements and second pixel elements arranged adjacent to each other, wherein the first pixel elements comprise a first sub-pixel and a second sub-pixel, and the second pixel elements comprise a third sub-pixel and a second sub-pixel, the first pixel elements and the second pixel elements are arranged alternately in the column direction, and the first pixel elements and the second pixel elements are arranged alternately in the row direction, in the first display sub-area.

2. The display substrate according to claim 1, wherein at least a part of sides of the second display sub-area coincide with at least a part of sides of the display area, and other sides of the second display sub-area are surrounded by the first display sub-area;
   wherein the first display sub-area and the second display sub-area are arranged in a row direction, or the first display sub-area and the second display sub-area are arranged in a column direction.

3. The display substrate according to claim 1, wherein the first display sub-area is arranged to surround the second display sub-area, or
   the second display sub-area is one of a round, a drop of water, a rectangle, and a trapezium, or
   the first display sub-area and the second display sub-area form a consecutive display area, and a shape of the display area is substantially rectangular, the second display sub-area is located at a corner of the display area, or
   an area of the second display sub-area is smaller than an area of the first display sub-area.

4. The display substrate according to claim 1, wherein the second display sub-area comprises a plurality of third pixel elements arranged in a rectangular pattern, and the third pixel elements comprise a first sub-pixel, a second sub-pixel, and a third sub-pixel; and
   in a same third pixel element, the first sub-pixel and the third sub-pixel are arranged in a same row and adjacent to each other, and the second sub-pixel is located in an adjacent row to a row where the first sub-pixel and the third sub-pixel are located.

5. The display substrate according to claim 4, wherein centers of sub-pixels with a same color among the first sub-pixels, the second sub-pixels, and the third sub-pixels in the second display sub-area are distributed uniformly, or
   sub-pixels with a same color among the first sub-pixels, the second sub-pixels, and the third sub-pixels in the second display sub-area are arranged at a uniform interval in the row direction, and arranged at a uniform interval in the column direction.

6. The display substrate according to claim 5, wherein in a case of that sub-pixels with a same color among the first sub-pixels, the second sub-pixels, and the third sub-pixels in the second display sub-area are arranged at a uniform interval in the row direction, and arranged at a uniform interval in the column direction, sub-pixels with a same color among the first sub-pixels, the second sub-pixels, and the third sub-pixels in the second display sub-area are arranged in different columns in adjacent rows, and centers of two adjacent sub-pixels in a same row have a same distance from a center of a sub-pixel which is in a row adjacent to the two adjacent sub-pixels and is closest to the two adjacent sub-pixels, or
   sub-pixels with a same color among the first sub-pixels, the second sub-pixels, and the third sub-pixels in the second display sub-area are arranged in different rows in adjacent columns, and centers of two adjacent sub-pixels in a same column have a same distance from a center of a sub-pixel which is in a column adjacent to the two adjacent sub-pixels and is closest to the two adjacent sub-pixels.

7. The display substrate according to claim 4, wherein sub-pixels in a same column of third pixel elements in the second display sub-area are arranged in a same or reverse pattern;
  wherein for two adjacent third pixel elements in the row direction in the second display sub-area, the first sub-pixel and the third sub-pixel in one of the third pixel elements are located in a same row as the second sub-pixel in the other third pixel element.

8. The display substrate according to claim 4, wherein in a same third pixel element in the second display sub-area, an orthographical projection of a center of the second sub-pixel onto a line connecting a center of the first sub-pixel with a center of the third sub-pixel lies between the center of the first sub-pixel and the center of the third sub-pixel;
  wherein sub-pixels with same color in adjacent third pixel elements in the row direction in the second display sub-area are not adjacent to each other;
  wherein light-emission areas of a first sub-pixel, a second sub-pixel, and a third sub-pixel in the second display sub-area are substantially same;
  wherein shapes of a first sub-pixel, a second sub-pixel, and a third sub-pixel in the second display sub-area are substantially same;
  wherein the first display sub-area comprises a plurality of first pixel elements and second pixel elements arranged adjacent to each other, wherein the first pixel elements comprise a first sub-pixel and a second sub-pixel, and the second pixel elements comprise a third sub-pixel and a second sub-pixel.

9. The display substrate according to claim 8,
  wherein the second sub-pixel and the first sub-pixel in the first pixel elements are arranged in a same row, and the second sub-pixel and the third sub-pixel in the second pixel elements are arranged in a same row; and
  for the first pixel element and the second pixel element adjacent in the row direction, the second sub-pixel in the first pixel element is not adjacent to the second sub-pixel in the second pixel element.

10. The display substrate according to claim 9, wherein in case of that the second sub-pixel and the first sub-pixel in the first pixel elements are arranged in a same row, and the second sub-pixel and the third sub-pixel in the second pixel elements are arranged in a same row; and for the first pixel element and the second pixel element adjacent in the row direction, the second sub-pixel in the first pixel element is not adjacent to the second sub-pixel in the second pixel element, light-emission areas of a first sub-pixel, a second sub-pixel, and a third sub-pixel in the first display sub-area are substantially same;
  wherein for the first pixel elements and the second pixel elements in a same column, the second sub-pixels in the first pixel elements are located in a same column as the second sub-pixels in the second pixel elements.

11. The display substrate according to claim 1, wherein a shape of the first sub-pixels in the first display sub-area is a rectangle.

12. The display substrate according to claim 1, wherein the second sub-pixel and the first sub-pixel in the first pixel element are arranged in a same row, and the second sub-pixel and the third sub-pixel in the second pixel element are arranged in different rows and in different columns; and two second sub-pixels are not adjacent to each other in the first pixel element and the second pixel element adjacent in the row direction; and
  the first pixel element and the second pixel element adjacent in the column direction are a group of pixels, and in a same group of pixels, the second sub-pixel in the first pixel element is located in a same column as the second sub-pixel in the second pixel element.

13. The display substrate according to claim 12, wherein in a same group of pixels, two second sub-pixels are arranged adjacent to each other in the column direction, and symmetric in the row direction, or
  two adjacent second sub-pixels in the column direction in the first display sub-area are a group of second sub-pixels, and a distance between two adjacent groups of second sub-pixels in the column direction in the first display sub-area is substantially equal to a distance between two adjacent second sub-pixels in the column direction in the second display sub-area, or
  in a same group of pixels, shapes of the first sub-pixel and the third sub-pixel are same, and a shape of a combination of two adjacent second sub-pixels in the column direction is same as a shape of the first sub-pixel.

14. The display substrate according to claim 13, wherein in a case of that in a same group of pixels, shapes of the first sub-pixel and the third sub-pixel are same, and a shape of a combination of two adjacent second sub-pixels in the column direction is same as a shape of the first sub-pixel, in the first display sub-area, a shape of the first sub-pixels, and a shape of the third sub-pixels 3 are a hexagon, and a shape of the second sub-pixels is a pentagon.

15. The display substrate according to claim 8, wherein a spacing between two adjacent first sub-pixels in the column direction in the first display sub-area is not larger than a spacing between two adjacent first sub-pixels in the column direction in the second display sub-area; and
  a spacing between two adjacent third sub-pixels in the column direction in the first display sub-area is not larger than a spacing between two adjacent third sub-pixels in the column direction in the second display sub-area, or
  wherein a light-emitting area of a second sub-pixel in the second display sub-area is not smaller than a light-emitting area of a second sub-pixel in the first display sub-area;
  a light-emitting area of a first sub-pixel in the second display sub-area is substantially equal to a light-emitting area of a first sub-pixel in the first display sub-area; and
  a light-emitting area of a third sub-pixel in the second display sub-area is substantially equal to a light-emitting area of a third sub-pixel in the first display sub-area, or
  wherein a shape of the first sub-pixels in the second display sub-area is substantially same as a shape of the first sub-pixels in the first display sub-area; and
  a shape of the third sub-pixels in the second display sub-area is substantially the same as a shape of the third sub-pixels in the first display sub-area, or
  wherein in the first display sub-area, a light-emitting area of a second sub-pixel is not larger than a light-emitting area of a first sub-pixel, and a light-emitting area of a second sub-pixel is not larger than a light-emitting area of a third sub-pixel, or
  wherein the sub-pixels in the second display sub-area are located in a same row as a part of the sub-pixels in the first display sub-area, or wherein the sub-pixels in the second display sub-area are be located in a same column as a part of the sub-pixels in the first display sub-area.

16. The display substrate according to claim 15, wherein the first sub-pixels in the second display sub-area, and the first sub-pixels in the first display sub-area are located in at least one of a same row and a same column, or wherein the second sub-pixels in the second display sub-area, and the second sub-pixels in the first display sub-area are located in at least one of a same row and a same column, or wherein the third sub-pixels in the second display sub-area, and the third sub-pixels in the first display sub-area are located in at least one of a same row and a same column, or wherein a distribution density of the first sub-pixels in the second display sub-area in the row direction is ½ of a distribution density of the first sub-pixels in the first display sub-area in the row direction;

a distribution density of the third sub-pixels in the second display sub-area in the row direction is ½ of a distribution density of the third sub-pixels in the first display sub-area in the row direction; and a distribution density of the second sub-pixels in the second display sub-area in the row direction is ¼ of a distribution density of the second sub-pixels in the first display sub-area in the row direction.

17. A display device, comprising the display substrate according to claim 1.

18. A fine metal mask for fabricating the display substrate according to claim 8, in case of that the first display sub-area comprises a plurality of first pixel elements and second pixel elements arranged adjacent to each other, wherein the first pixel elements comprise a first sub-pixel and a second sub-pixel, and the second pixel elements comprise a third sub-pixel and a second sub-pixel, the fine metal mask comprising a plurality of opening areas corresponding in shape and position to one of the first sub-pixels, the second sub-pixels, and the third sub-pixels.

19. A display method of the display substrate according to claim 1, the method comprising:

receiving raw image data; and for a pixel in the first display sub-area, displaying at a grayscale of corresponding pixel in the raw image data;

for a pixel in the second display sub-area, determining a quantity N of pixels in the raw image data, corresponding to a pixel according to a ratio of the distribution density of pixels in the first display sub-area to the distribution density of pixels in the second display sub-area; and displaying according to a grayscale or grayscales of one or more of the N pixels in the raw image data, corresponding to the position of the pixel.

20. The method according to claim 19, wherein for a pixel in the second display sub-area, displaying at an average grayscale of the N pixels in the raw image data, corresponding to the position of the pixel, or wherein for a pixel in the second display sub-area, displaying at a grayscale of the pixel of highest brightness among the N pixels in the raw image data, corresponding to the position of the pixel, or wherein for a pixel in the second display sub-area, displaying at a grayscale of a pixel of intermediate brightness among the N pixels in the raw image data, corresponding to the position of the pixel, or wherein for a pixel in the second display sub-area, displaying according to the N pixels in the raw image data, corresponding to the position of the pixel, and a relative position relationship between the pixel in the second display sub-area, and the N pixels in the raw image data, wherein the ratio of the distribution density of pixels in the first display sub-area to the distribution density in the second display sub-area is n, wherein n is an integer greater than 1; and a pixel in the second display area corresponds to n*n pixels, arranged in a rectangular pattern, in the raw image data; for a pixel in the second display sub-area, a pixel at a same position among n*n pixel in the raw image data, corresponding to the pixel is a reference pixel, and displaying the pixel in the second display sub-area at a grayscale of the reference pixel corresponding to the pixel.

* * * * *